US012707698B2

(12) United States Patent
Nishiwaki et al.

(10) Patent No.: US 12,707,698 B2
(45) Date of Patent: Aug. 11, 2026

(54) SEMICONDUCTOR DEVICE AND METHOD FOR MANUFACTURING

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsuya Nishiwaki, Yokohama (JP); Ryohei Gejo, Kawasaki (JP); Tomoko Matsudai, Tokyo (JP)

(73) Assignees: KABUSHIKI KAISHA TOSHIBA, Kawasaki (JP); TOSHIBA ELECTRONIC DEVICES & STORAGE CORPORATION, Kawasaki (JP)

( * ) Notice: Subject to any disclaimer, the term of this patent is extended or adjusted under 35 U.S.C. 154(b) by 807 days.

(21) Appl. No.: 17/900,433

(22) Filed: Aug. 31, 2022

(65) Prior Publication Data

US 2023/0299178 A1 Sep. 21, 2023

(30) Foreign Application Priority Data

Mar. 16, 2022 (JP) ................................ 2022-041060

(51) Int. Cl.
*H10D 64/01* (2025.01)
*H10D 8/60* (2025.01)
(Continued)

(52) U.S. Cl.
CPC ............. *H10D 64/021* (2025.01); *H10D 8/60* (2025.01); *H10D 62/126* (2025.01);
(Continued)

(58) Field of Classification Search
CPC ...... H10D 64/021; H10D 8/60; H10D 62/126; H10D 62/393; H10D 62/60; H10D 8/00;
(Continued)

(56) References Cited

U.S. PATENT DOCUMENTS

| | | | |
|---|---|---|---|
| 6,737,743 | B2 | 5/2004 | Urakawa |
| 9,620,631 | B2 | 4/2017 | Matsudai et al. |
| 2007/0262390 | A1 | 11/2007 | Ishida et al. |

(Continued)

FOREIGN PATENT DOCUMENTS

| | | | |
|---|---|---|---|
| JP | H01222458 | A | 9/1989 |
| JP | H03136368 | A | 6/1991 |

(Continued)

OTHER PUBLICATIONS

Japanese Office Action (and an English language translation thereof) dated Mar. 18, 2025, issued in counterpart Japanese Application No. 2022-041060.

*Primary Examiner* — Jack S Chen
(74) *Attorney, Agent, or Firm* — Holtz, Holtz & Volek PC

(57) ABSTRACT

A semiconductor device includes a first electrode, a plurality of unit element regions, and a partitioning region. Each of the unit element regions includes a first semiconductor part, a second electrode, and a first conductive part. The first semiconductor part includes first to third semiconductor regions. The first semiconductor region is located above the first electrode. The second semiconductor region is located on the first semiconductor region. The third semiconductor region is located on the second semiconductor region. The second electrode is located on the second and third semiconductor regions. The first conductive part faces the second semiconductor region via a first insulating film. At least a portion of the plurality of unit element regions includes a common pattern. The partitioning region includes a second semiconductor part and partitions the plurality of unit element regions. The second semiconductor part is continuous with the first semiconductor part.

16 Claims, 27 Drawing Sheets

(51) Int. Cl.

| | |
|---|---|
| ***H10D 62/10*** | (2025.01) |
| ***H10D 62/17*** | (2025.01) |
| ***H10D 62/60*** | (2025.01) |
| ***H10P 54/00*** | (2026.01) |

(52) U.S. Cl.
CPC ........... *H10D 62/393* (2025.01); *H10D 62/60* (2025.01); *H10P 54/00* (2026.01)

(58) Field of Classification Search
CPC ............... H10D 30/668; H10D 12/481; H10D 30/0295; H10D 30/0297; H10D 64/256; H10D 64/117; H10D 62/127; H10D 84/0109; H10D 84/038; H10D 89/10; H01L 21/78
See application file for complete search history.

(56) References Cited

U.S. PATENT DOCUMENTS

| | | | | |
|---|---|---|---|---|
| 2012/0112308 A1* | 5/2012 | Matsuda | .............. | H10D 30/665<br>438/460 |
| 2020/0411642 A1 | 12/2020 | Ueno | | |

FOREIGN PATENT DOCUMENTS

| | | | |
|---|---|---|---|
| JP | H053285 | A | 1/1993 |
| JP | 2003023138 | A | 1/2003 |
| JP | 2005101198 | A | 4/2005 |
| JP | 2007305751 | A | 11/2007 |
| JP | 2012104513 | A | 5/2012 |
| JP | 2016213421 | A | 12/2016 |
| JP | 2021005610 | A | 1/2021 |

* cited by examiner

AA,A3 61 T1,31 71 32 75 71 T1,31 72 DA 62 72 T1,31 71 AA,A1 75 71 61 72 44 40 140 T1,31
72 E E
41
12
41
12
72
12
41
41
12
72
72
71 32 75 71 72 72 71 75 71
AA,A4 61 T1,31 T1,31 61 AA,A2

AA,A3
12c
DA
d3
AA,A1
161
61
12
13
77
12
40
44
41
41
77
77
d2
d1
13
13
41
41
12
d4
77
13
C1
12
AA,A4
AA,A2

SEMICONDUCTOR DEVICE AND METHOD FOR MANUFACTURING

CROSS-REFERENCE TO RELATED APPLICATIONS

This application is based upon and claims the benefit of priority from Japanese Patent Application No. 2022-041060, filed on Mar. 16, 2022; the entire contents of which are incorporated herein by reference.

FIELD

Embodiments relate to a semiconductor device and a method of manufacturing.

BACKGROUND

Semiconductor devices that include, for example, transistors and the like may be produced as products of various chip sizes according to characteristics such as the desired current value and the like. It is desirable to increase the productivity of such a semiconductor device.

DETAILED DESCRIPTION

Figure 1:
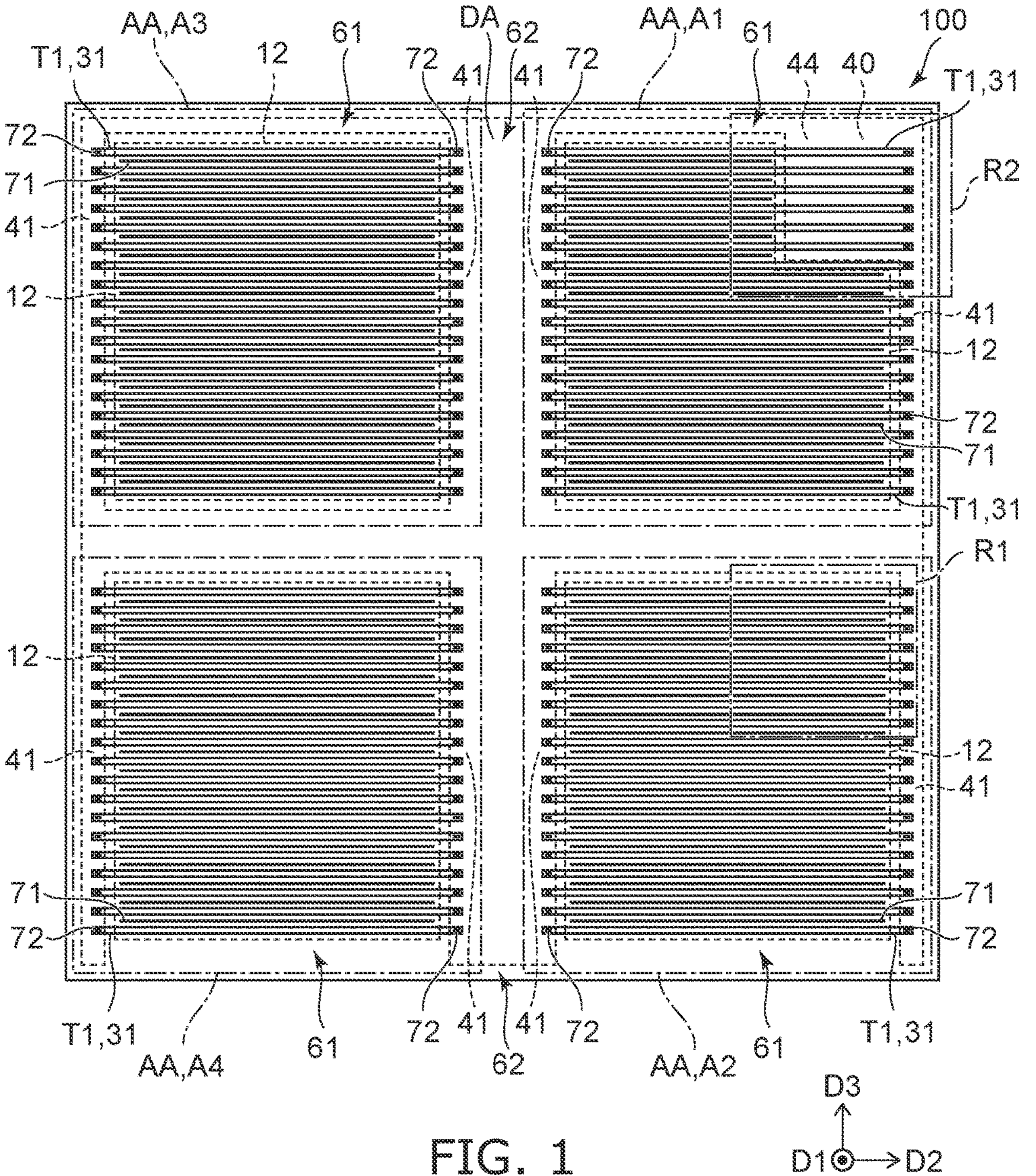
FIG. 1 is a schematic plan view illustrating a semiconductor device according to a first embodiment.

According to one embodiment, a semiconductor device includes a first electrode, a plurality of unit element regions, and a partitioning region. Each of the unit element regions includes a first semiconductor part, a second electrode, and a first conductive part. The first semiconductor part includes a first semiconductor region, a second semiconductor region, and a third semiconductor region. The first semiconductor region is located above the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The second electrode is located on the second and third semiconductor regions and electrically connected with the second and third semiconductor regions. The first conductive part faces the second semiconductor region via a first insulating film. At least a portion of the plurality of unit element regions includes a common pattern. The partitioning region includes a second semiconductor part and partitions the plurality of unit element regions. The second semiconductor part is continuous with the first semiconductor part.

According to one embodiment, a semiconductor device includes a first electrode, a first semiconductor part, a second electrode, a plurality of first trenches, a first wiring part, a plurality of first conductive parts, a conductive region. The first semiconductor part includes a first semiconductor region, a second semiconductor region, and a third semiconductor region. The first semiconductor region is located above the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The second electrode is located on the second and third semiconductor regions and electrically connected with the second and third semiconductor regions. The plurality of first trenches is provided in the first semiconductor part. The plurality of first trenches extends in an extension direction along a surface of the first semiconductor part. The first wiring part is located above the first semiconductor part. The plurality of first conductive parts is located inside the plurality of first trenches and electrically connected with the first wiring part. Each of the plurality of first conductive parts faces the second semiconductor region via a first insulating film. The conductive region is located above the first semiconductor part and electrically connected with the first wiring part. The conductive region is wider than the first wiring part. A portion of the plurality of first trenches includes a first trench part and a second trench part. The first trench part is located under the second electrode. The second trench part is located under the conductive region. The conductive region extends in the extension direction from the first trench part.

According to one embodiment, a method for manufacturing a semiconductor device is provided. The semiconductor device includes a first electrode and at least one unit element region. The unit element region includes a first semiconductor part, a second electrode, and a first conductive part. The first semiconductor part includes a first semiconductor region, a second semiconductor region, and a third semiconductor region. The first semiconductor region is located above the first electrode. The first semiconductor region is of a first conductivity type. The second semiconductor region is located on the first semiconductor region. The second semiconductor region is of a second conductivity type. The third semiconductor region is located on the second semiconductor region. The third semiconductor region is of the first conductivity type. The second electrode is located on the second and third semiconductor regions. The second electrode is electrically connected with the second and third semiconductor regions. The first conductive part includes a portion facing the second semiconductor region via an insulating film. The method includes preparing a wafer in which a plurality of the unit element regions and a partitioning region are set. The partitioning region partitions the plurality of unit element regions. The method includes singulating the wafer by cutting a portion of the partitioning region at a cutting position. The cutting position is modifiable according to a number and arrangement of the unit element regions included in the semiconductor device.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the embodiments described below, each embodiment may be implemented by inverting the p-type (an example of the second conductivity type) and the n-type (an example of the first conductivity type) of each semiconductor region.

First Embodiment

FIG. 1 is a schematic plan view illustrating a semiconductor device according to a first embodiment.

The semiconductor device 100 according to the first embodiment includes multiple unit element regions AA and a partitioning region DA. For example, a semiconductor element such as a MOSFET (metal-oxide-semiconductor field-effect transistor), an IGBT (insulated gate bipolar transistor), or the like is formed in the unit element region AA. In the example, four unit element regions (first to fourth unit element regions A1 to A4) are provided as the multiple unit element regions AA. The semiconductor device 100 has a 2×2 layout in which two unit element regions AA are arranged longitudinally (a third direction D3 in the drawing) and two unit element regions AA are arranged laterally (a second direction D2 in the figure). However, according to the embodiment, the number of the unit element regions AA is an integer of not less than 1 and is not particularly limited. Three or more unit element regions AA may be arranged in at least one of the second direction D2 or the third direction D3. For example, the multiple unit element regions AA are periodically arranged in at least one of the second direction D2 or the third direction D3. The unit element region AA is, for example, a rectangular region that has two sides extending in the second direction D2 and two sides extending in the third direction D3. When viewed from above, the multiple unit element regions AA have the same outer perimeter shape and surface area (size).

The partitioning region DA is located between the adjacent unit element regions AA and partitions the multiple unit element regions AA. For example, the partitioning region DA is continuous with the multiple unit element regions AA, and in the example, is lattice-shaped (cross-shaped). In the example, elements such as transistors, etc., are not located in the partitioning region DA.

Multiple electrodes (a second electrode 12 and a conductive film 40 that includes a first wiring part 41) are located at the upper surface of the semiconductor device 100. FIG. 1 (and FIGS. 9 to 12, FIG. 15, FIG. 17, FIG. 21, FIG. 23, FIG. 24, and FIG. 26 described below) are perspective views schematically illustrating layouts of layers under the multiple electrodes by illustrating the multiple electrodes with broken lines.

The semiconductor device 100 includes one semiconductor substrate. Each of the unit element regions AA includes a first semiconductor part 61 that is a portion of the semiconductor substrate. The partitioning region DA includes a second semiconductor part 62 that is another portion of the semiconductor substrate. The second semiconductor part 62 is continuous with the first semiconductor part 61.

Figure 2:
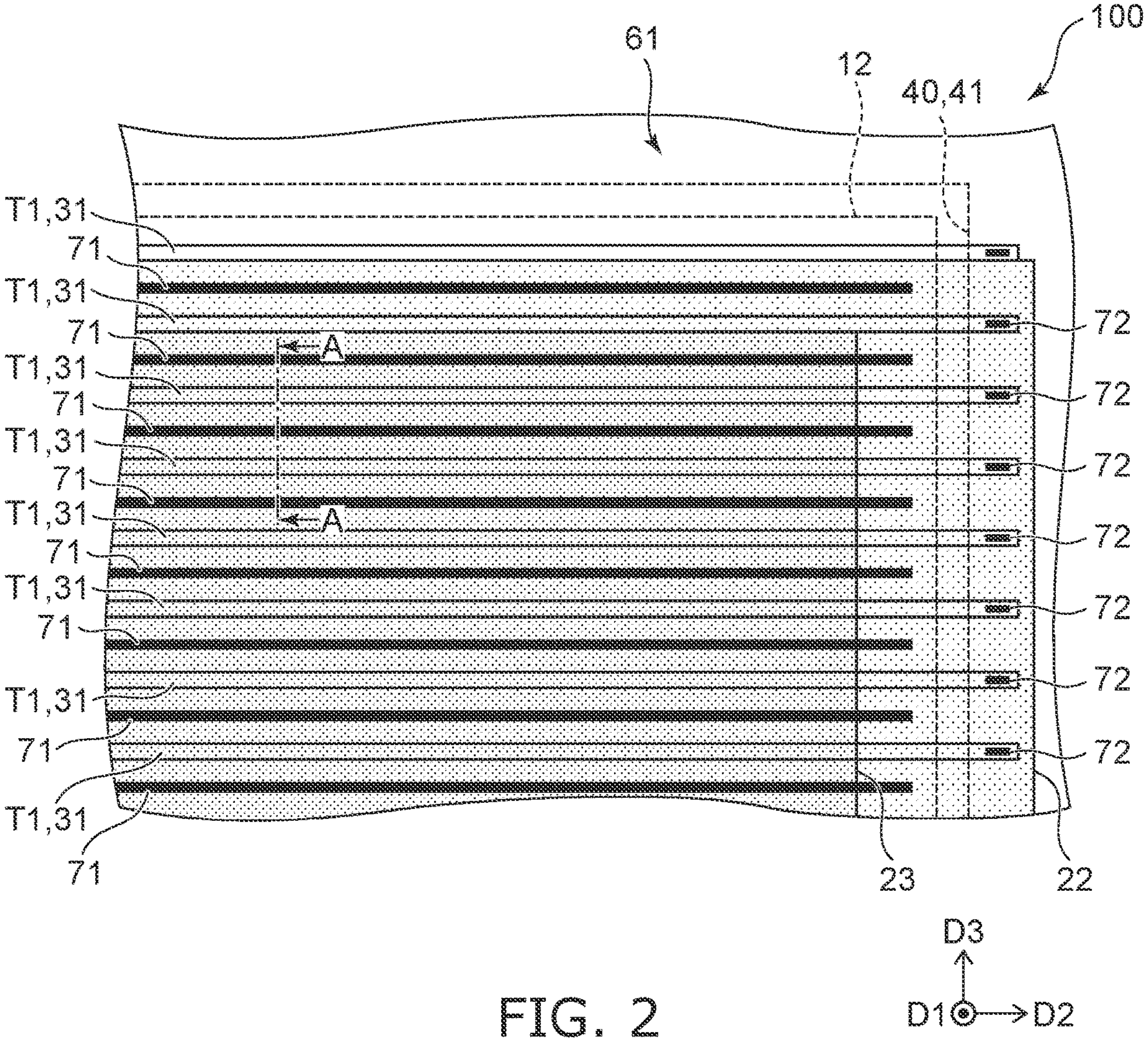
FIG. 2 is a schematic plan view illustrating the semiconductor device according to the first embodiment.

FIG. 2 is a schematic plan view illustrating the semiconductor device according to the first embodiment.

Figure 3:
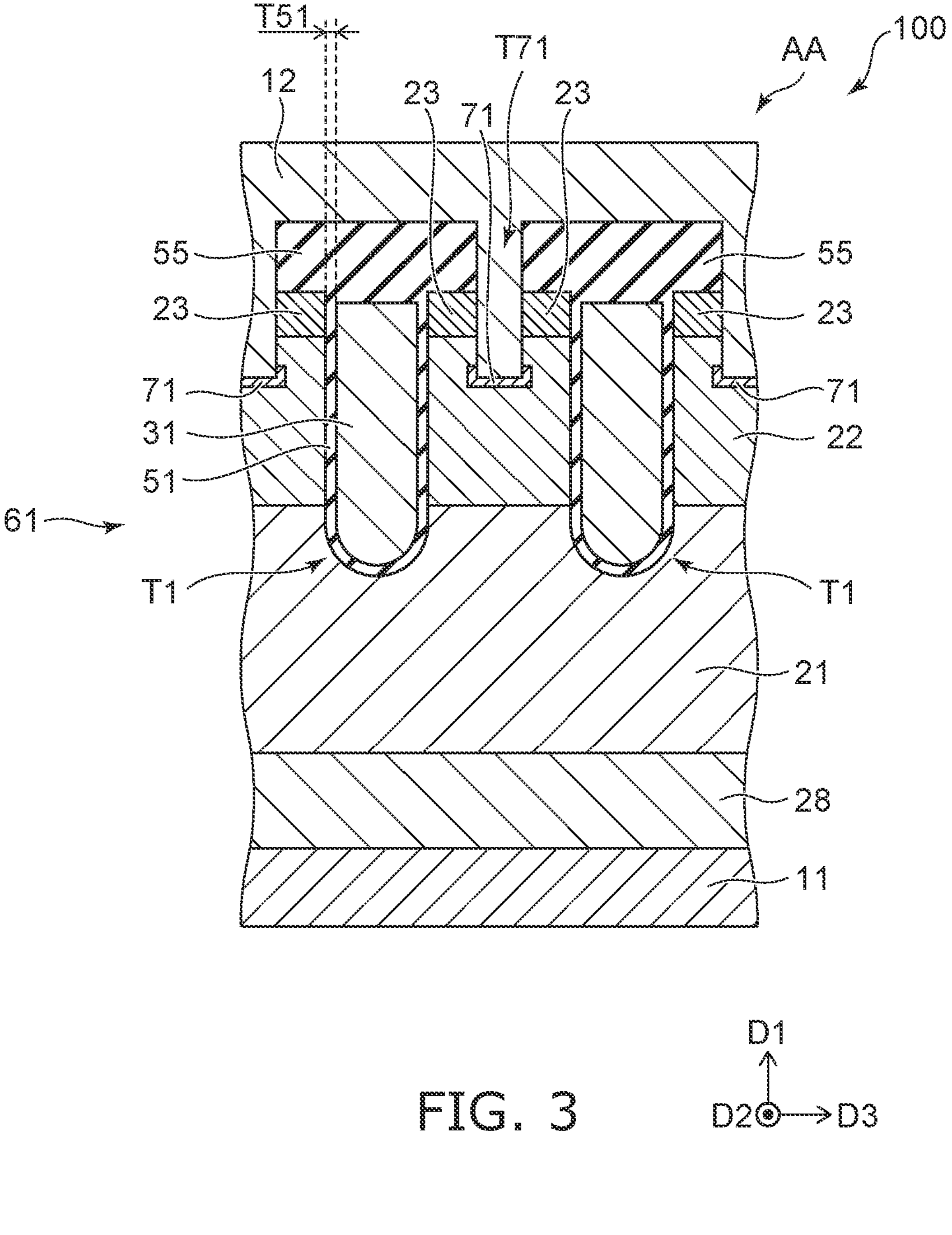
FIG. 3 is a schematic cross-sectional view illustrating the semiconductor device according to the first embodiment.

FIG. 3 is a schematic cross-sectional view illustrating the semiconductor device according to the first embodiment.

FIG. 2 is an enlarged illustration of the vicinity of a region R1 shown in FIG. 1. FIG. 3 is a line A-A cross section shown in FIG. 2.

For example, the semiconductor device 100 is a MOSFET. As illustrated in FIG. 3, the semiconductor device 100 includes a first electrode 11 (a drain electrode). The first semiconductor part 61 of the unit element region AA is located on the first electrode 11.

A first direction D1, a second direction D2, and a third direction D3 are used in the description of the embodiment. The direction from the first electrode 11 toward the first semiconductor part 61 is taken as the first direction D1. One direction perpendicular to the first direction D1 is taken as the second direction D2. A direction that is perpendicular to the first direction D1 and perpendicular to the second direction D2 is taken as the third direction D3. In the description, the direction from the first electrode 11 toward the first semiconductor part 61 is called "up", and the opposite direction is called "down". These directions are based on the relative positional relationship between the first electrode 11 and the first semiconductor part 61 and are independent of the direction of gravity.

As illustrated in FIG. 3, the first semiconductor part 61 includes a semiconductor region 28 (a drain region), a first semiconductor region 21 (a drift region), a second semiconductor region 22 (a base region), multiple third semiconductor regions 23 (source regions), and multiple contact parts 71 (cell contacts). In FIG. 2 (and FIG. 4, FIG. 13, and FIG. 19 described below), the area in which the second semiconductor region 22 and the third semiconductor region 23 are located is illustrated by dots.

The first semiconductor region 21 is located above the first electrode 11 with the semiconductor region 28 interposed. The first semiconductor region 21 is electrically connected with the first electrode 11 via the semiconductor region 28. The first semiconductor region 21 and the semiconductor region 28 are of a first conductivity type (an n-type). The first-conductivity-type impurity concentration of the first semiconductor region 21 is less than the first-conductivity-type impurity concentration of the semiconductor region 28.

The second semiconductor region 22 is located on a portion of the first semiconductor region 21. The second semiconductor region 22 is of a second conductivity type (a p-type).

The third semiconductor region 23 is located on a portion of the second semiconductor region 22. The third semiconductor region 23 is of the first conductivity type. The first-conductivity-type impurity concentration of the third semiconductor region 23 is greater than the first-conductivity-type impurity concentration of the first semiconductor region 21. The multiple third semiconductor regions 23 are arranged in the third direction D3; and each third semiconductor region 23 extends in the second direction D2.

The multiple contact parts 71 are located on a portion of the second semiconductor region 22. The contact part 71 is of the second conductivity type. The second-conductivity-type impurity concentration of the contact part 71 is greater than the second-conductivity-type impurity concentration of the second semiconductor region 22. The multiple contact parts 71 are arranged in the third direction D3; and each contact part 71 extend in the second direction D2. When viewed from above, one contact part 71 is located between two adjacent third semiconductor regions 23.

As illustrated in FIG. 3, each of the unit element regions AA further includes multiple first trenches T1, multiple first conductive parts 31 (gate electrodes), multiple first insulating films 51 (gate insulating films), and the second electrode 12 (the source electrode).

The first conductive part 31 is located on a portion of the first semiconductor region 21. The first conductive part 31 includes a portion that faces the side surface of the second semiconductor region 22 via the first insulating film 51. The first conductive part 31 also includes a portion that faces the side surface of the first semiconductor region 21 via the first insulating film 51, and a portion that faces the side surface of the third semiconductor region 23 via the first insulating film 51. The first conductive part 31 is arranged in the third direction D3 with the first to third semiconductor regions 21 to 23. The multiple first conductive parts 31 are arranged in the third direction D3; and each first conductive part 31 extends in the second direction D2.

The first trench T1 is a recess provided in the first semiconductor part 61 downward from the upper portion of the first semiconductor part 61. The first trench T1 extends in an extension direction (in the example, the second direction D2) along the surface of the first semiconductor part 61. The multiple first trenches T1 are arranged in the third direction D3. The first insulating film 51 is located at the inner wall of the first trench T1. The multiple first conductive parts 31 are located inside the multiple first trenches T1. Two third semiconductor regions 23 are located between two adjacent first trenches T1.

The second electrode 12 is located on the first conductive part 31, the second semiconductor region 22, and the third semiconductor region 23. The second electrode 12 is electrically connected with the second and third semiconductor regions 22 and 23. An insulating film 55 is located between the first conductive part 31 and the second electrode 12; and the first conductive part 31 and the second electrode 12 are insulated.

The second electrode 12 extends to the contact part 71 below the second electrode 12. The contact part 71 electrically connects the second electrode 12 with the second semiconductor region 22.

As illustrated in FIGS. 1 and 2, each of the multiple unit element regions AA includes the first wiring part 41 (gate wiring) and multiple contact parts 72 (gate contacts). The first wiring part 41 is located above the first semiconductor part 61 and arranged with the second electrode 12 in a direction perpendicular to the first direction D1. The first wiring part 41 is located on two end portions in the extension direction (the second direction D2) of the multiple trenches T1 and the multiple first conductive parts 31. Each first conductive part 31 is electrically connected with the first wiring part 41 via the contact part 72.

As illustrated in FIG. 1, the multiple first wiring parts 41 that are located in the multiple unit element regions AA are continuous and electrically connected to each other. For example, the first wiring part 41 of the first unit element region A1 is continuous with the first wiring part 41 of the second unit element region A2. The multiple first wiring parts 41 each may be a portion of one continuous conductive film 40. The conductive film 40 is located in the multiple unit element regions AA and the partitioning region DA.

In each unit element region AA, each contact part 72 electrically connects the first conductive part 31 to the first wiring part 41. For example, the multiple contact parts 72 of the second unit element region A2 electrically connect the multiple first conductive parts 31 of the second unit element region A2 to the first wiring part 41 of the second unit element region A2.

The contact parts 72 are located on the two extension-direction end portions of each first conductive part 31. For example, the contact parts 72 are continuous with the conductive film 40 that includes the first wiring part 41, and extend downward from the conductive film 40 to contact the first conductive parts 31. The contact parts 72 may be portions of the conductive film 40. For example, the contact parts 72 extend through the insulating film 55 on the first conductive parts 31 to contact the first conductive parts 31.

The multiple second electrodes 12 that are located in the multiple unit element regions AA may be electrically connected to each other by, for example, bonding or the like and may be set to the same potential.

As illustrated in FIG. 2, the third semiconductor region 23 is located below the second electrode 12 but is not located below the conductive film 40. The second semiconductor region 22 is located below the second electrode 12 and extends below the conductive film 40. The second semiconductor region 22 may not be provided in the partitioning region DA.

According to the embodiment, the multiple unit element regions AA include a common pattern. At least a portion of the multiple unit element regions AA includes the common pattern. For example, the pattern of at least a portion of one unit element region AA is common with the pattern of at least a portion of another unit element region AA.

When viewed from above, the pattern of at least a portion of the unit element region AA is the number, positions, and shapes in the unit element region AA of at least a portion of the components included in the unit element region AA. "Common" (or "same") is not limited to exactly the same and includes substantially the same. For example, "common" (or "same") includes a degree of difference caused by fluctuation of the process conditions, etc.

Specifically, in the example, the common pattern is a pattern of the first conductive part 31, a pattern of the first trench T1, a pattern of the contact part 71, a pattern of the contact part 72, and a pattern of the second semiconductor region 22. The common pattern is periodically repeated at the same period as the period of the multiple unit element regions AA.

For example, the number, positions, and shapes of the multiple first conductive parts 31 in the first unit element region A1 are common with the number, positions, and shapes of the multiple first conductive parts 31 in the second unit element region A2.

For example, the number, positions, and shapes of the multiple first trenches T1 in the first unit element region A1 are common with the number, positions, and shapes of the multiple first trenches T1 in the second unit element region A2.

For example, the number, positions, and shapes of the multiple contact parts 71 in the first unit element region A1 are common with the number, positions, and shapes of the multiple contact parts 71 in the second unit element region A2.

For example, the number, positions, and shapes of the multiple contact parts 72 in the first unit element region A1 are common with the number, positions, and shapes of the multiple contact parts 72 in the second unit element region A2.

For example, the number, positions, and shapes of the second semiconductor region 22 in the first unit element region A1 are common with the number, positions, and shapes of the second semiconductor region 22 in the second unit element region A2.

These patterns (the pattern of the multiple first conductive parts 31, the pattern of the multiple first trenches T1, the pattern of the multiple contact parts 71, the pattern of the multiple contact parts 72, and the pattern of the second semiconductor region 22) may be common among all of the unit element regions AA. The partitioning region DA may not include the common pattern of the unit element regions AA.

Figure 4:
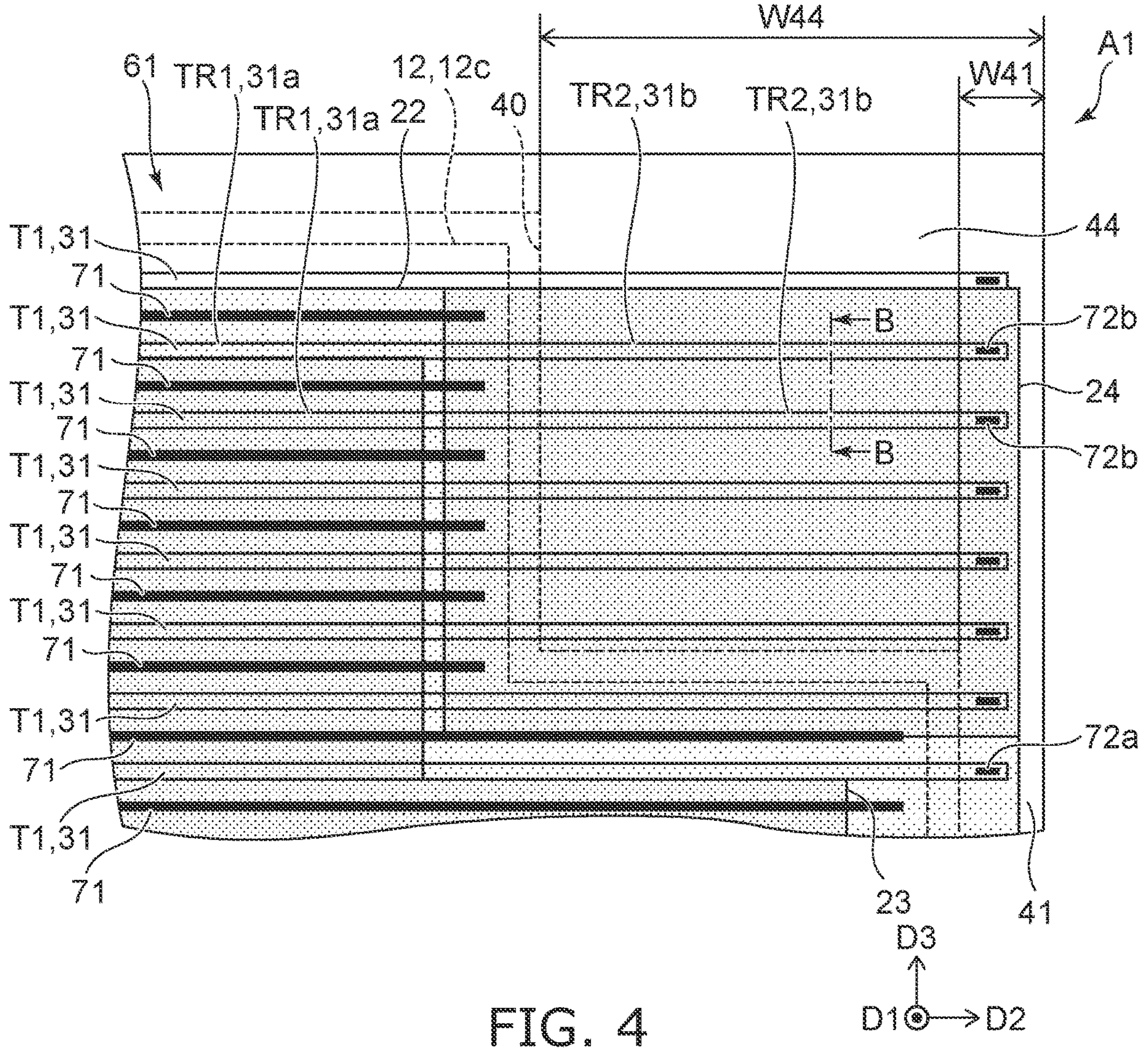
FIG. 4 is a schematic plan view illustrating the semiconductor device according to the first embodiment.

FIG. 4 is a schematic plan view illustrating the semiconductor device according to the first embodiment.

FIG. 4 is an enlarged illustration of the vicinity of a region R2 shown in FIG. 1. In FIG. 4, the area in which a fourth semiconductor region 24 described below is located is illustrated by dots. A conductive region 44 (a gate pad) is located in at least one among the multiple unit element regions AA. In the example, the first unit element region A1 includes the conductive region 44; and the second to fourth unit element regions A2 to A4 do not include the conductive region 44. The conductive region 44 in the first unit element region A1 is located above the first semiconductor part 61 and electrically connected with the first wiring part 41. The conductive region 44 is continuous with the first wiring part 41. The conductive region 44 may be a portion of the conductive film 40 that includes the first wiring part 41.

The conductive region 44 is wider than the first wiring part 41. In other words, as illustrated in FIG. 4, a width W44 in the second direction D2 of the conductive region 44 is greater than a width W41 in the second direction D2 of the first wiring part 41. The width W41 is the width of the region of the conductive film that is positioned at the end portion in the second direction D2 of the first unit element region A1 and extends in the third direction D3.

In the first unit element region A1, a portion of the multiple first trenches T1 extends below the conductive region 44. More specifically, as illustrated in FIG. 4, a portion of the multiple first trenches T1 includes a first trench part TR1 and a second trench part TR2. The first trench part TR1 is located under the second electrode 12 and contacts the third semiconductor region 23 (the source region). The second trench part TR2 extends in the second direction D2 from the first trench part TR1 and is located under the conductive region 44. The length of the first trench T1 extending below the conductive region 44 is equal to the length of the first trench T1 not located below the conductive region 44. The second trench part TR2 extends to the outer perimeter portion of the first unit element region A1. In other words, the second trench part TR2 extends below the end portion of the conductive region 44 at the side opposite to the first trench part TR1.

In the example, a portion of the multiple first conductive parts 31 includes a first portion 31*a* and a second portion 31*b*. The first portion 31*a* is located inside the first trench part TR1. The second portion 31*b* extends in the second direction D2 from the first portion 31*a* and is located inside the second trench part TR2.

The multiple contact parts 72 of the first unit element region A1 electrically connect the multiple first conductive parts 31 of the first unit element region A1 to the first wiring part 41 and the conductive region 44 of the first unit element region A1. Specifically, in the first unit element region A1, the multiple contact parts 72 include a contact part 72*a* and a contact part 72*b*. The contact part 72*a* is positioned between the first wiring part 41 and the first conductive part 31 in the vertical direction. The contact part 72*b* is positioned between the conductive region 44 and the second portion 31*b* of the first conductive part 31 in the vertical direction. The contact part 72*b* extends downward from the conductive region 44 and is electrically connected to the second portion 31*b*.

Figure 5:
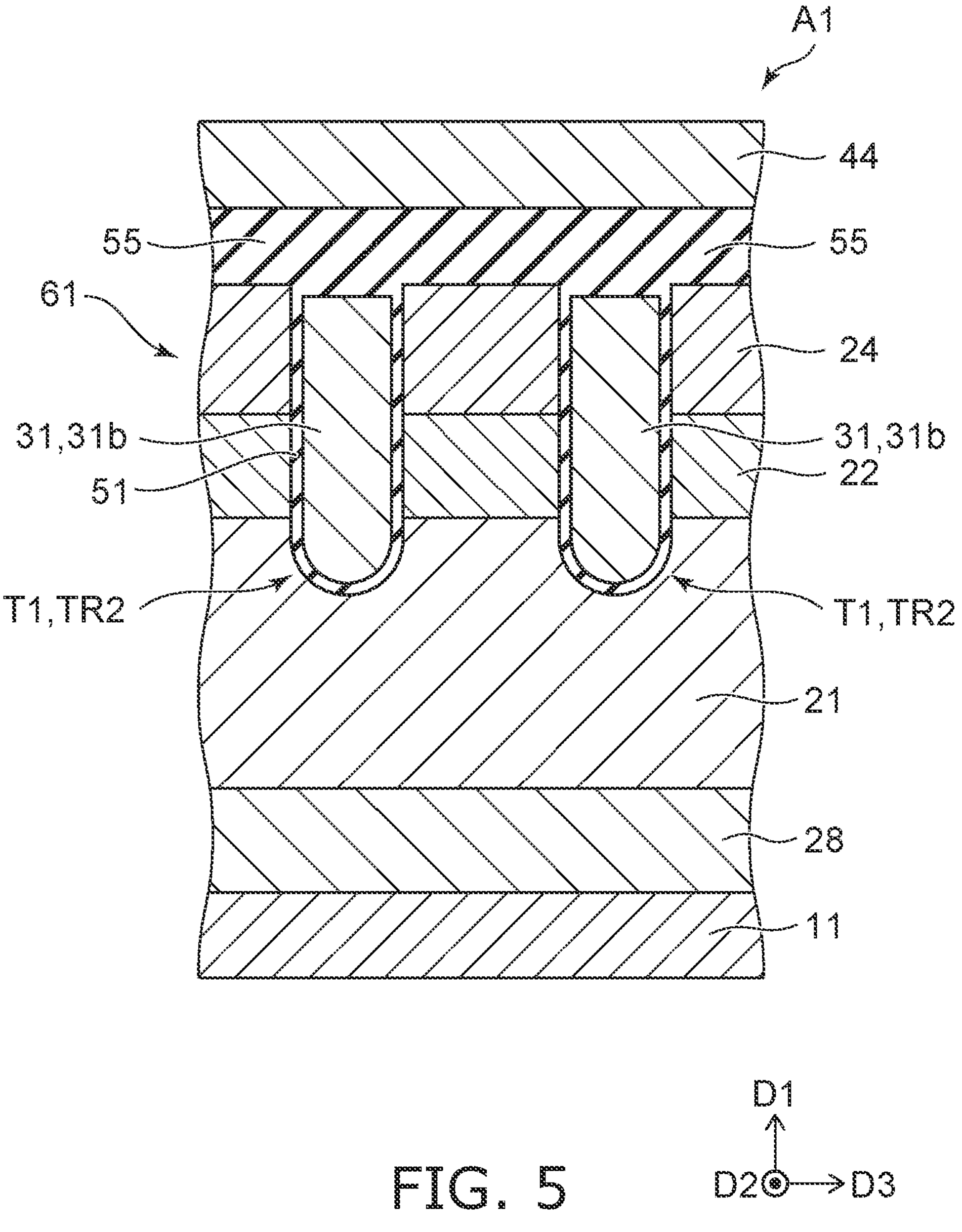
FIG. 5 is a schematic cross-sectional view illustrating the semiconductor device according to the first embodiment.

FIG. 5 is a schematic cross-sectional view illustrating the semiconductor device according to the first embodiment.

FIG. 5 illustrates a line B-B cross section shown in FIG. 4. In the first unit element region A1, the first semiconductor part 61 further includes the fourth semiconductor region 24. The fourth semiconductor region 24 is positioned below the conductive region 44. The fourth semiconductor region 24 is located between the second semiconductor region 22 and the insulating film 55. The fourth semiconductor region 24 is of the second conductivity type. The second-conductivity-type impurity concentration of the fourth semiconductor region 24 is greater than the second-conductivity-type impurity concentration of the second semiconductor region 22. The second portion 31*b* of the first conductive part 31 faces the side surface of the fourth semiconductor region 24 via the first insulating film 51.

As illustrated in FIG. 4, a portion of the fourth semiconductor region 24 extends below the end portion of the second electrode 12. For example, the end portion of the fourth semiconductor region 24 contacts the end portions in the second direction D2 of a portion of the contact parts 71. The fourth semiconductor region 24 is arranged with the third semiconductor region 23 in the second direction D2.

Examples of the materials of the components of the semiconductor device 100 will now be described.

The first semiconductor part 61 (the first to fourth semiconductor regions 21 to 24, the semiconductor region 28, and the cell contact) and the second semiconductor part 62 include silicon, silicon carbide, gallium nitride, or gallium arsenide as a semiconductor material. When silicon is used as the semiconductor material, arsenic, phosphorus, or antimony can be used as the n-type impurity. Boron can be used as the p-type impurity.

The first conductive part 31 includes a conductive material such as polysilicon, etc. An impurity may be added to the conductive material.

The first insulating film 51 and the insulating film 55 include insulating materials such as silicon oxide, silicon nitride, etc.

The first electrode 11, the second electrode 12 (conductive films 12*a* to 12*c*), the conductive film 40, and the contact part 72 are conductive parts that include a metal such as aluminum, copper, etc.

Operations of the semiconductor device 100 will now be described.

A voltage that is not less than a threshold is applied to the first conductive part 31 in a state in which a positive voltage with respect to the second electrode 12 is applied to the first electrode 11. Thereby, a channel (an inversion layer) is formed in the second semiconductor region 22; and the semiconductor device 100 is set to the on-state. Electrons pass through the channel and flow from the second electrode 12 toward the first electrode 11. Subsequently, when the voltage that is applied to the first conductive part 31 drops below the threshold, the channel in the second semiconductor region 22 disappears, and the semiconductor device 100 is set to the off-state.

For example, in the off-state, a depletion layer spreads toward the first semiconductor region 21 from the interface between the first semiconductor region 21 and the first insulating film 51 due to the positive voltage with respect to the second electrode 12 that is applied to the first electrode 11. When the depletion layer spreads to the first semiconductor region 21, the carriers (electrons and holes) generated by impact ionization, etc., are accelerated inside the depletion layer; and there are cases where avalanche breakdown occurs. When avalanche breakdown occurs, the electrons pass through the semiconductor region 28 and are discharged from the first electrode 11. The holes pass through the contact part 71 and are discharged to the second electrode 12.

A method for manufacturing the semiconductor device 100 will now be described.

Figure 6A:
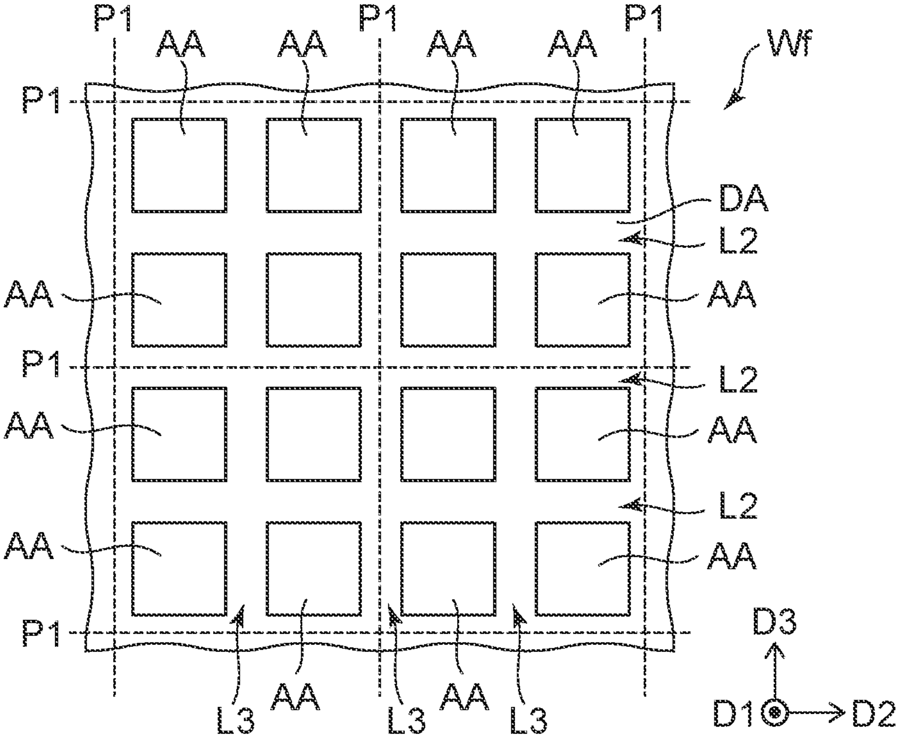
FIGS. 6A and 6B are schematic plan views illustrating the method for manufacturing the semiconductor device according to the first embodiment.
Figure 6B:
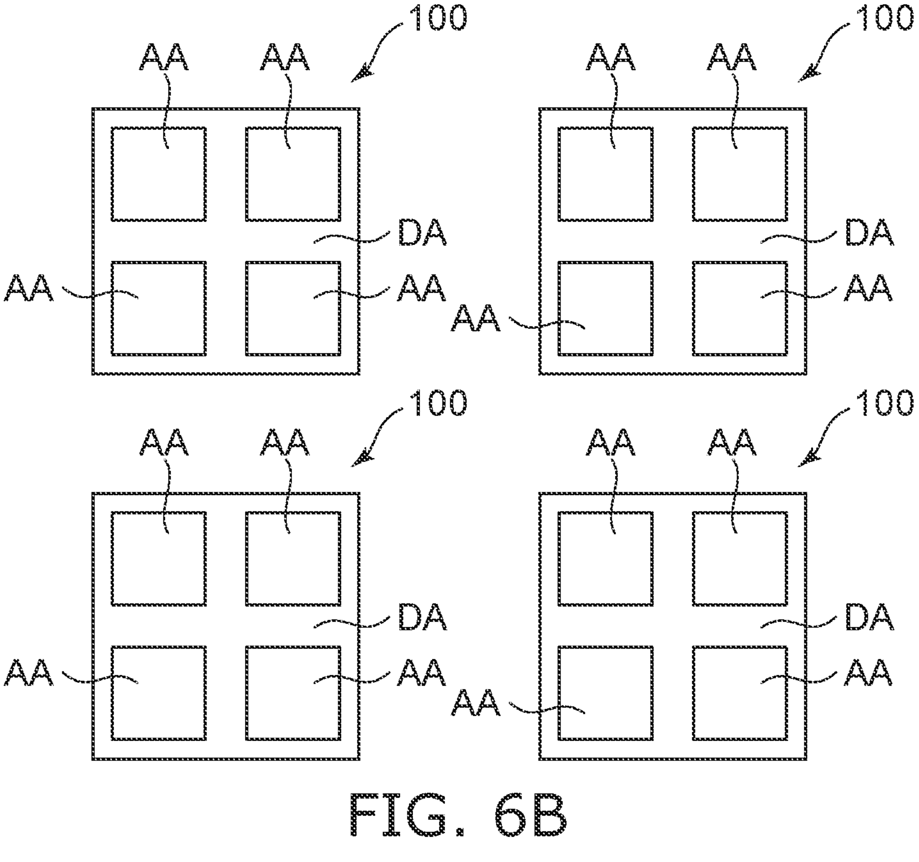

FIGS. 6A and 6B are schematic plan views illustrating the method for manufacturing the semiconductor device according to the first embodiment.

As illustrated in FIG. 6A, the method for manufacturing the semiconductor device 100 includes a process of preparing a wafer Wf. The multiple unit element regions AA and the partitioning region DA are set in the wafer Wf. The partitioning region DA is, for example, a region that can be used as a dicing line.

The method for manufacturing the semiconductor device 100 further includes a process (a dicing process) of singulating the wafer Wf by cutting a portion of the partitioning region DA. A dicing blade or the like is used for the cutting as appropriate. For example, the wafer Wf is cut at a cutting position P1 shown in FIG. 6A. In other words, every other line in the longitudinal direction and every other line in the lateral direction of the lattice-shaped partitioning region DA are set as the cutting position P1. Thereby, the semiconductor device 100 that has the 2×2 layout shown in FIG. 6B is manufactured.

The cutting position P1 is modifiable according to information of the size of the semiconductor device to be manufactured. The information of the size of the semiconductor device includes the number and arrangement of the unit element regions AA included in one semiconductor device. In other words, in the example, the information of the size of the semiconductor device includes a 2×2 layout. More specifically, as illustrated in FIG. 6A, the lattice-shaped partitioning region DA includes multiple longitudinal lines L3 (regions extending in the third direction D3) and multiple lateral lines L2 (regions extending in the second direction D2). At least a portion of the lines of the multiple longitudinal lines L3 and at least a portion of the lines of the multiple lateral lines L2 are selected as the cutting positions P1 according to the information of the size of the semiconductor device. The dicing process cuts the wafer Wf at the selected cutting positions P1.

For example, the information of the size of the semiconductor device may be a layout of one unit element region AA. In such a case, the cutting positions P1 are all of the longitudinal and lateral lines of the lattice-shaped partitioning region DA. For example, the information of the size of the semiconductor device may be a 3×3 layout in which three unit element regions AA are arranged longitudinally and three unit element regions AA are arranged laterally. In such a case, the cutting positions P1 are every two longitudinal lines and every two lateral lines of the lattice-shaped partitioning region DA. Thus, the cutting position P1 is modifiable as appropriate according to the number and arrangement of the unit element regions AA included in the semiconductor device to be manufactured. The information of the size of the semiconductor device is not limited to that described above, is arbitrary, and may be a 2×1 layout (two unit element regions AA longitudinally and one unit element region AA laterally) or a 2×3 layout (two unit element regions AA longitudinally and three unit element regions AA laterally).

FIGS. 7A to 7H and FIGS. 8A to 8E are schematic cross-sectional views in order of the processes, illustrating the method for manufacturing the semiconductor device according to the first embodiment.

Figure 7A:
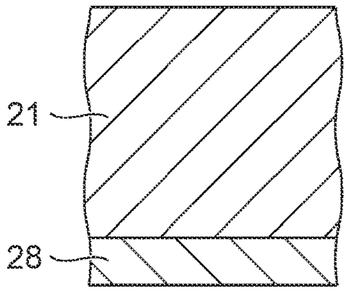
FIGS. 7A to 7H are schematic cross-sectional views in order of the processes, illustrating the method for manufacturing the semiconductor device according to the first embodiment.

These drawings illustrate a process of preparing the wafer Wf. As illustrated in FIG. 7A, a substrate in which the first semiconductor region 21 is formed on the semiconductor region 28 is prepared.

Figure 7B:
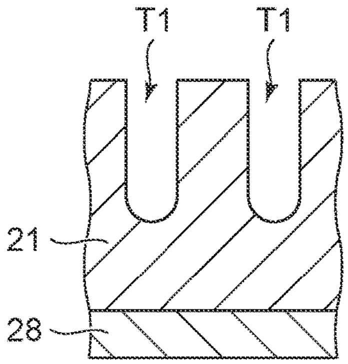

As illustrated in FIG. 7B, the first trenches T1 are formed in the surface of the substrate by using photolithography, RIE (Reactive Ion Etching), etc.

Figure 7C:
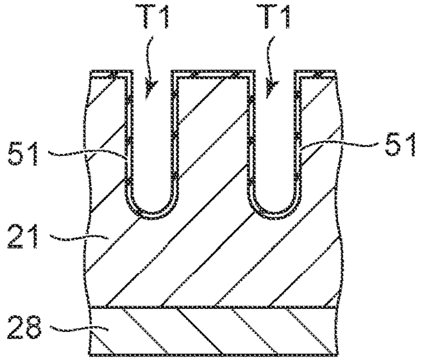

As illustrated in FIG. 7C, for example, an insulating film is formed on the substrate surface by using thermal oxidation, etc. Thereby, the first insulating film 51 is formed on the inner walls of the first trenches T1.

Figure 7D:
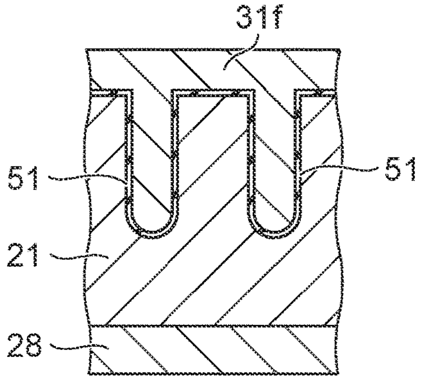

As illustrated in FIG. 7D, a conductive film 31*f* that is used to form the first conductive parts 31 is formed on the substrate surface and inside the first trenches T1.

Figure 7E:
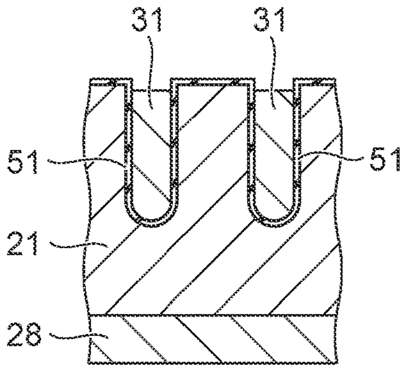

As illustrated in FIG. 7E, the portion of the conductive film 31*f* other than the portions inside the first trenches T1 are removed using, for example, CDE (Chemical Dry Etching), RIE, etc. The first conductive parts 31 are formed thereby.

Figure 7F:
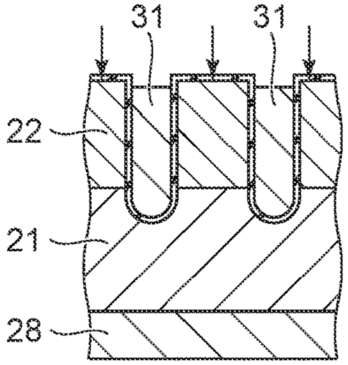

As illustrated in FIG. 7F, the second semiconductor region 22 is formed by, for example, ion-implanting boron.

Figure 7G:
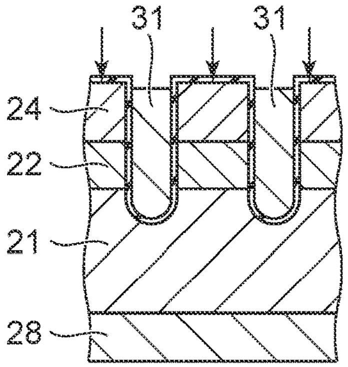

As illustrated in FIG. 7G, the fourth semiconductor region 24 is formed by, for example, ion-implanting boron ($^{11}B$) or $BF_2$.

Figure 7H:
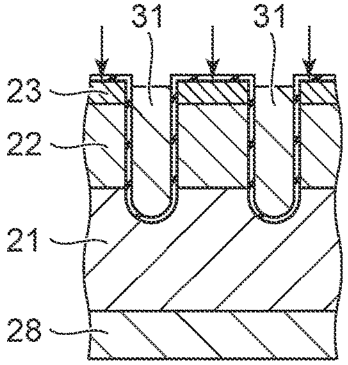

As illustrated in FIG. 7H, the third semiconductor region 23 is formed by, for example, ion-implanting phosphorus or arsenic.

Figure 8A:
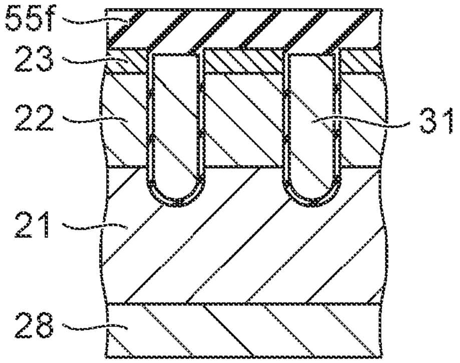
FIGS. 8A to 8E are schematic cross-sectional views in order of the processes, illustrating the method for manufacturing the semiconductor device according to the first embodiment.

As illustrated in FIG. 8A, for example, a film 55*f* that is used to form the insulating film 55 is formed on the substrate by CVD (chemical vapor deposition), etc.

Figure 8D:
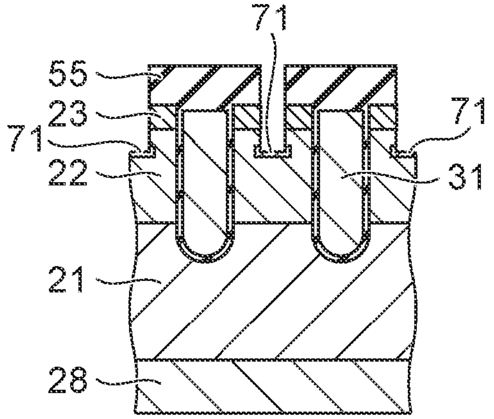
Figure 8B:
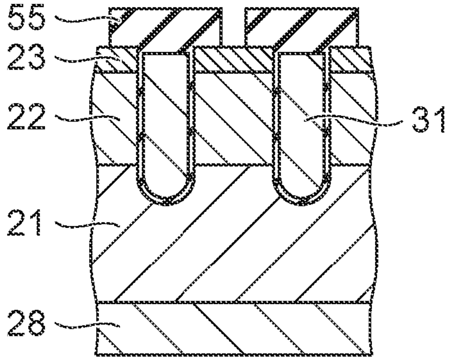

As illustrated in FIG. 8B, for example, the insulating film 55 is formed by removing a portion of the film 55*f* by RIE, etc.

Figure 8E:
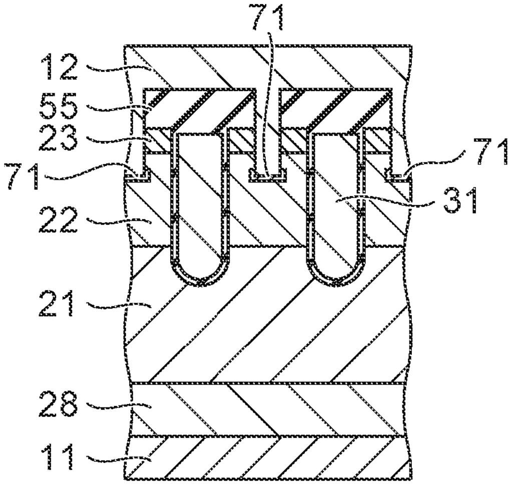
Figure 8C:
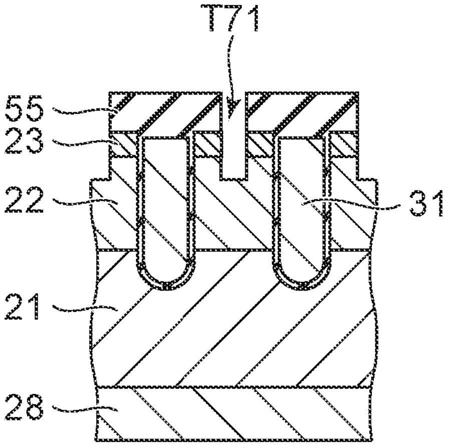

As illustrated in FIG. 8C, trenches T71 are formed in the second and third semiconductor regions 22 and 23 by, for example, RIE, etc., using the insulating film 55 as a mask.

As illustrated in FIG. 8D, the contact parts 71 are formed at the bottom portions of the trenches T71 formed in FIG. 8C by, for example, ion implantation, etc.

As illustrated in FIG. 8E, the second electrode 12 is formed on the surface of the substrate. Also, the conductive film 40 (the first wiring part 41 and the conductive region 44) is formed. Subsequently, the first electrode 11 is formed on the back surface of the substrate.

Effects of the first embodiment will now be described.

According to the embodiment, at least a portion of the multiple unit element regions AA includes a common pattern. For example, at least a portion of one of the multiple unit element regions AA includes a common pattern with at least a portion of another one of the multiple unit element regions AA. In such a case, the process of forming the common pattern can be performed regardless of the information of the size of the semiconductor device. The productivity of the semiconductor device can be increased thereby. For example, the processes of forming the common pattern can be used commonly even when semiconductor devices of different sizes are manufactured. For example, in the semiconductor device 100 illustrated in FIG. 1, etc., as described above, the pattern of the multiple first trenches T1, the pattern of the multiple first conductive parts 31, and the pattern of the second semiconductor region 22 are common in the multiple unit element regions AA. Therefore, the process of forming the first trench T1 (FIG. 7B), the process of forming the first conductive part 31 (FIG. 7E), and the process of forming the second semiconductor region 22 (FIG. 7F) are performed regardless of the information of the size of the semiconductor device 100. That is, the processes up to FIGS. 7A to 7F can be performed regardless of the information of the size of the semiconductor device 100.

For example, there are cases where it is necessary for semiconductor devices such as power devices, etc., to have various chip sizes according to the desired current value and/or on-resistance. On the other hand, there are cases where it takes much development time when devices of various chip sizes are to be manufactured. Also, there are cases where many products of different chip sizes are kept in inventory to reduce the lead time. In contrast, according to the embodiment, an integer multiple of the basic size, i.e., the minimum-unit-sized chip (the unit element region AA) is arranged longitudinally and laterally and treated as one chip. For example, one chip has a configuration in which multiple unit element regions are periodically arranged and combined. Thereby, the processes up to the intermediate processes (in the example, the diffusion process of FIG. 7F) are used commonly; and the substantial manufacturing period can be reduced by keeping inventory of wafers for which the manufacturing up to the intermediate processes is finished. For example, lot splitting or the like can be performed after the intermediate processes so that each wafer can be used to manufacture chips of a different size.

On the other hand, the positions of the conductive region 44 (the gate pad) and the fourth semiconductor region 24 are determined according to the information of the size (the chip size) of the semiconductor device. That is, the unit element region AA (the first unit element region A1) in which the conductive region 44 and the fourth semiconductor region 24 are formed is determined according to the information of the size of the semiconductor device. The pattern of the third semiconductor region 23, the pattern of the second electrode 12, the pattern of the multiple contact parts 71, etc., are determined thereby. Therefore, the process of forming the fourth semiconductor region 24 (FIG. 7G), the process of forming the third semiconductor region 23 (FIG. 7H), the process of forming the multiple contact parts 71 (FIGS. 8C and 8D), and the process of forming the second electrode 12 (FIG. 8E) are performed according to the information of the size of the semiconductor device 100. Then, in the process of singulating the wafer, the devices of the desired chip sizes can be manufactured because the cutting position is modifiable according to the information of the size of the semiconductor device.

For example, the conductive region 44 is formed in one of the multiple unit element regions AA (the first unit element region A1); and the conductive region 44 is not formed in the other unit element regions AA (the second to fourth unit element regions A2 to A4). In the other unit element regions AA, extensions of the second semiconductor region 22, the third semiconductor region 23, the contact part 71, etc., are formed in the region corresponding to the position of the conductive region 44. Thereby, the region that corresponds to the position of the conductive region 44 can be used as an effective element. The effective area can be increased; for example, the on-resistance for the same chip area can be reduced.

In the example illustrated in FIG. 4, etc., as described above, in the first unit element region A1, a portion of the multiple first trenches T1 extends below the conductive region 44. In other words, a portion of the first trenches T1 includes the first trench part TR1 that is located below the second electrode 12, and the second trench part TR2 that extends in the second direction from the first trench T1 and is located under the conductive region 44. Thereby, the pattern of the multiple first trenches T1 in the first unit element region A1 can be common with the pattern of the multiple first trenches T1 in the other unit element regions AA. The uniformity of the layout of the multiple first trenches T1 also can be increased.

Because the first trench T1 extends below the conductive region 44, the pattern of the multiple contact parts 72 of the first unit element region A1 is common with the pattern of the multiple contact parts 72 of the second unit element region A2. For example, the uniformity of the layout of the multiple contact parts 72 can be increased thereby.

In the first unit element region A1, the multiple contact parts 71 are located below the second electrode 12 but are not located below the conductive region 44. In such a case, for example, when the avalanche breakdown described above occurs, there is a risk that the potential of the second semiconductor region 22 below the conductive region 44 may rise, and discrepancies may occur. For example, as described with reference to FIGS. 4 and 5, when the first insulating film 51 and the second portion 31*b* of the first conductive part 31 are located inside the second trench part TR2 below the conductive region 44, there is a risk that breakdown of the first insulating film 51 may occur. In contrast, the fourth semiconductor region 24 is included in the semiconductor device 100. The resistance is low because the fourth semiconductor region 24 has a higher second-conductivity-type impurity concentration than the second semiconductor region 22. The potential rise can be suppressed thereby, and the breakdown of the first insulating film 51 can be suppressed.

Modification 1

Figure 9:
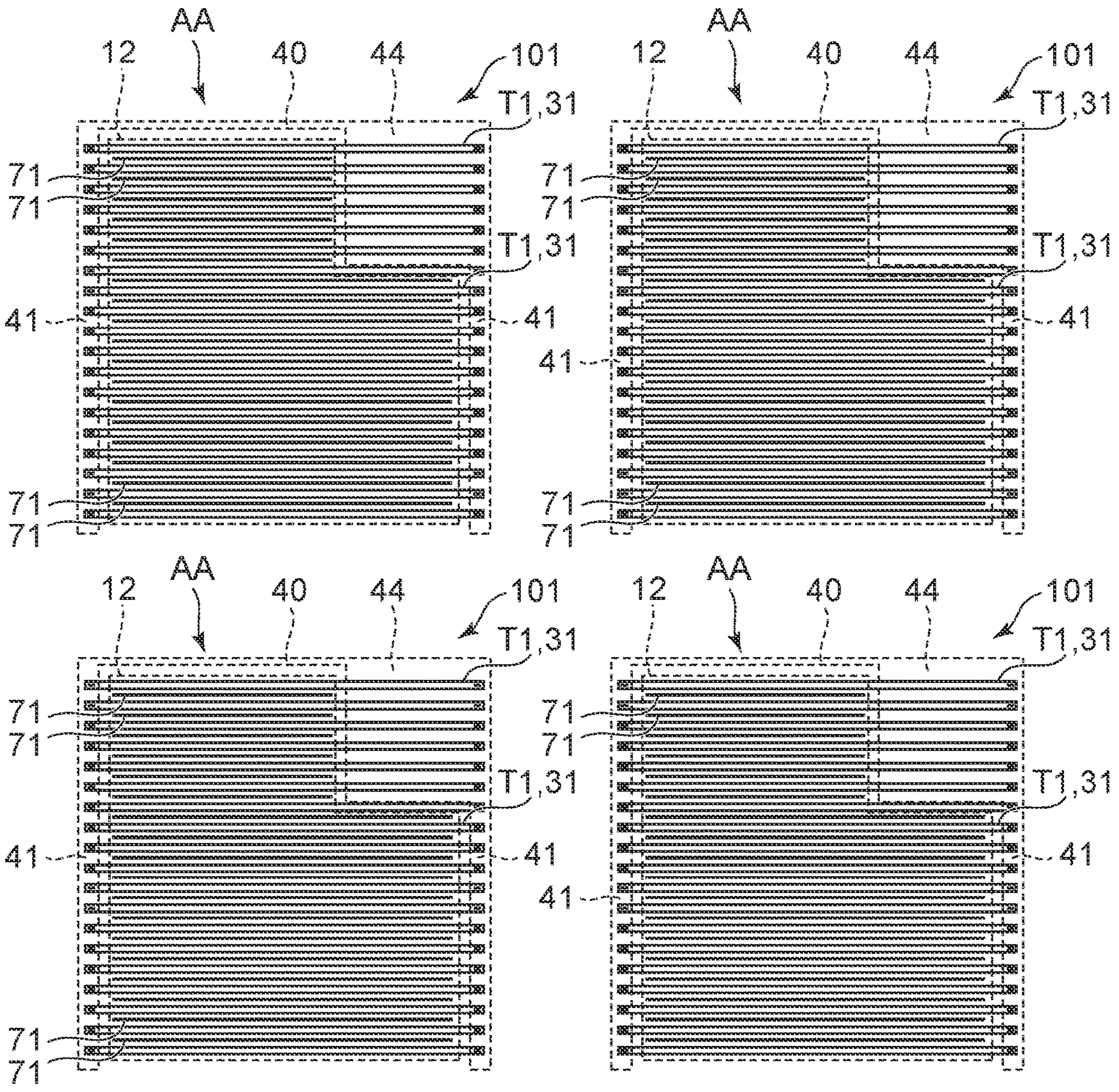
FIG. 9 is a schematic plan view illustrating a modification of the semiconductor device according to the first embodiment.

FIG. 9 is a schematic plan view illustrating a modification of the semiconductor device according to the first embodiment.

FIG. 9 illustrates the layout when there is one unit element region AA. Each semiconductor device 101 includes one unit element region AA. The conductive region 44 is formed in each of the multiple unit element regions AA in the manufacturing processes of the semiconductor device 101. In each unit element region AA, a portion of the first trench T1 extends below the conductive region 44; and the fourth semiconductor region 24 is formed below the conductive region 44.

In such a case as well, the process of forming the multiple first trenches T1, the process of forming the multiple first conductive parts 31, the process of forming the second semiconductor region 22, etc., are independent of the information of the size of the semiconductor device. Therefore, these processes can be the same as the processes of the manufacture of the semiconductor device 100.

Modification 2

Figure 10:
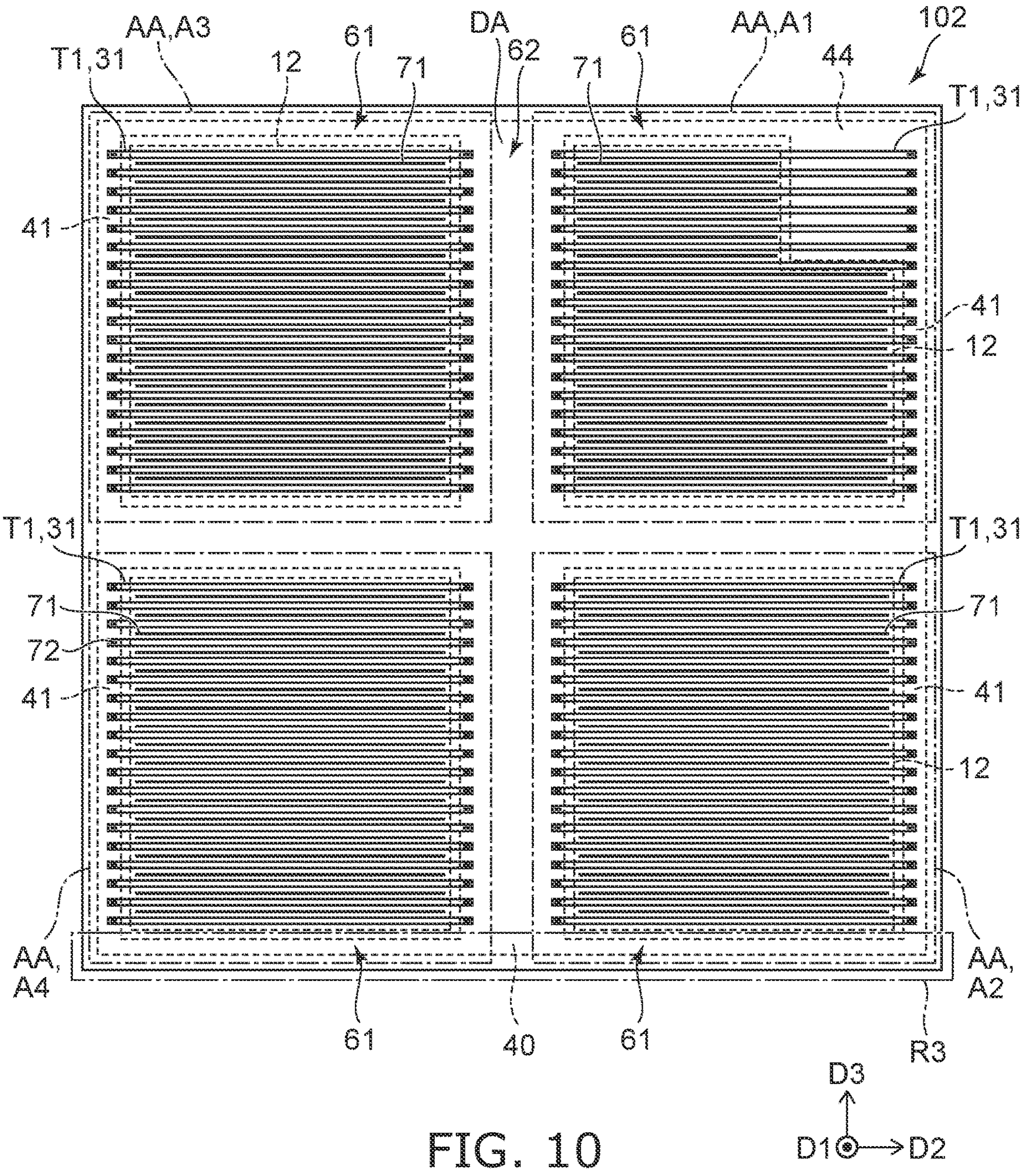
FIG. 10 is a schematic plan view illustrating a modification of the semiconductor device according to the first embodiment.

FIG. 10 is a schematic plan view illustrating a modification of the semiconductor device according to the first embodiment.

The planar shape of the conductive film 40 of the semiconductor device 102 is different from that of the semiconductor device 100 shown in FIG. 1. Specifically, in the semiconductor device 102, the conductive film 40 further includes a portion shown at the vicinity of a region R3 of FIG. 10. In other words, the conductive film 40 includes the first wiring part 41 and surrounds the second electrode 12 in each of the multiple unit element regions AA. For example, the entire outer perimeter of each second electrode 12 is surrounded with the conductive film 40. For example, the surface area of the conductive film 40 can be increased thereby, and the resistance (e.g., the gate wiring resistance) of the conductive film 40 can be reduced.

Modification 3

Figure 11:
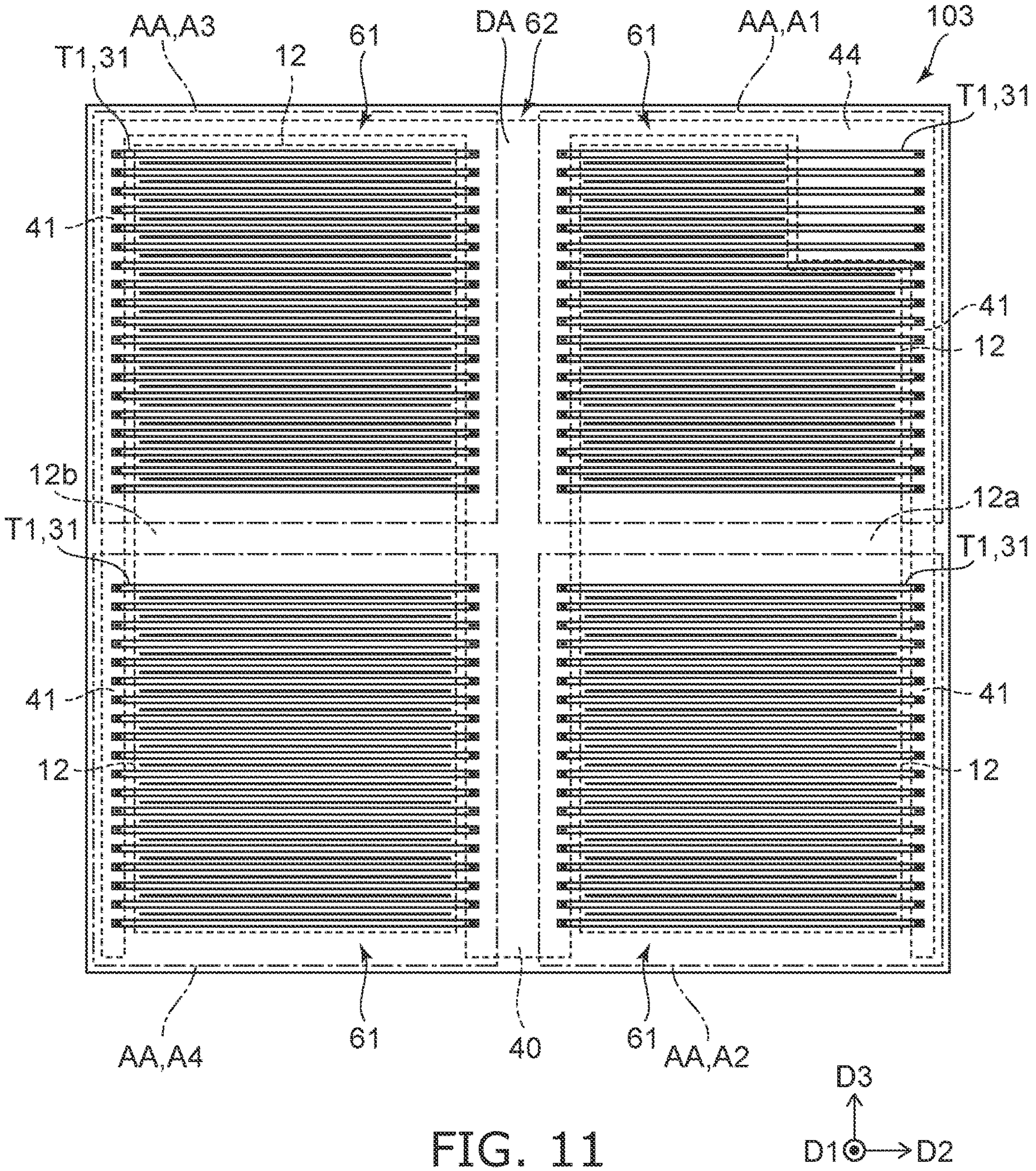
FIG. 11 is a schematic plan view illustrating a modification of the semiconductor device according to the first embodiment.

FIG. 11 is a schematic plan view illustrating a modification of the semiconductor device according to the first embodiment.

The planar shapes of the second electrode 12 and the conductive film 40 of the semiconductor device 103 are different from those of the semiconductor device 100 shown in FIG. 1. Specifically, in the semiconductor device 103, the second electrode 12 of the first unit element region A1 and the second electrode 12 of the second unit element region A2 are formed as one conductive film 12*a* and are continuous and electrically connected. Compared to the semiconductor device 100, the conductive film 40 is not formed in the partitioning region DA between the first unit element region A1 and the second unit element region A2; instead, the conductive film 12*a* is formed. Similarly, in the semiconductor device 103, the second electrode 12 of the third unit element region A3 and the second electrode 12 of the fourth unit element region A4 are formed as one conductive film 12*b* and are continuous and electrically connected. Compared to the semiconductor device 100, the conductive film is not formed in the partitioning region DA between the third unit element region A3 and the fourth unit element region A4; instead, the conductive film 12*b* is formed. The surface area of the conductive film forming the second electrode 12 can be increased thereby, and the resistance (e.g., the source wiring resistance) of the second electrode 12 can be reduced.

Modification 4

Figure 12:
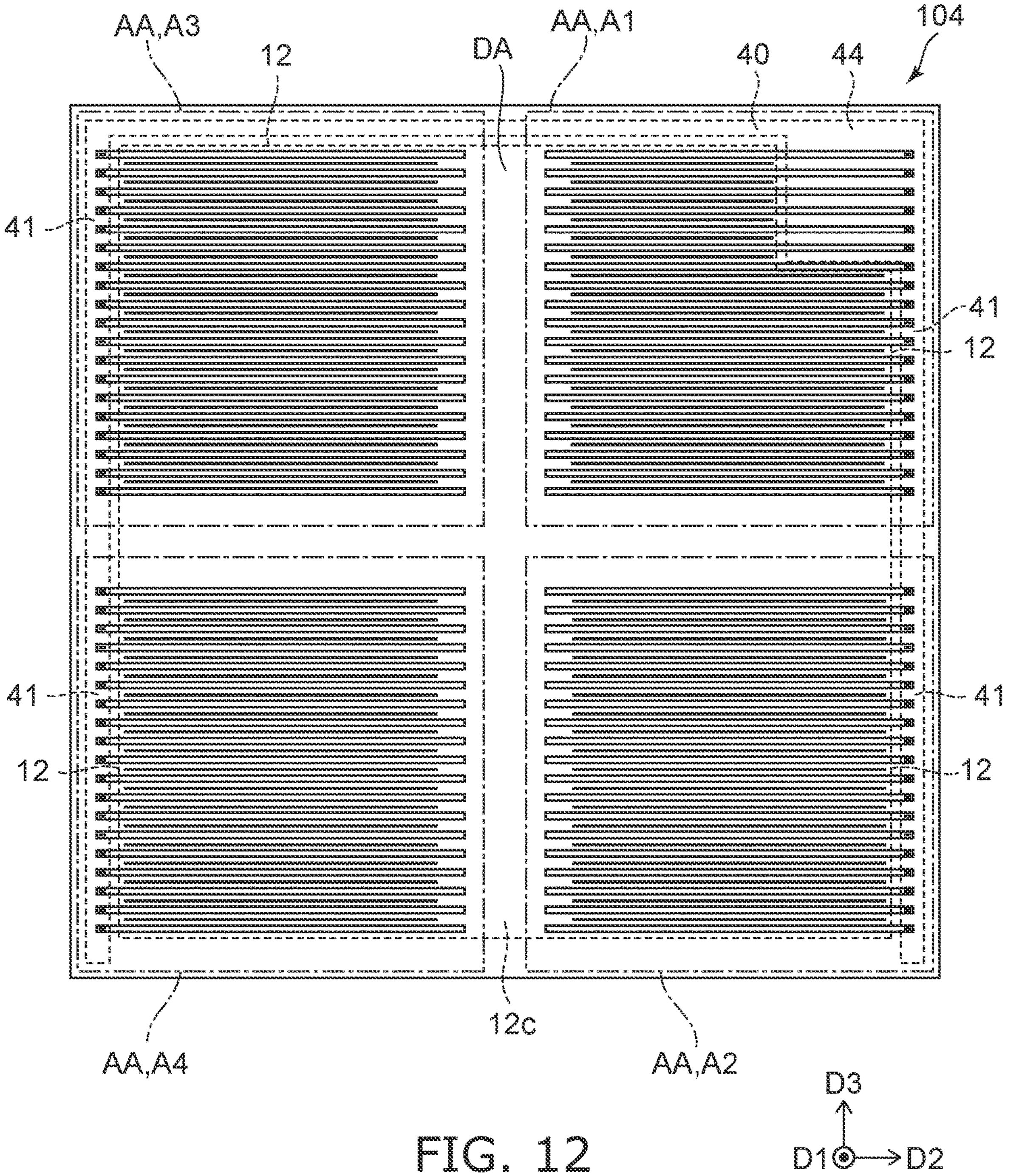
FIG. 12 is a schematic plan view illustrating a modification of the semiconductor device according to the first embodiment.

FIG. 12 is a schematic plan view illustrating a modification of the semiconductor device according to the first embodiment.

The planar shapes of the second electrode 12, the conductive film 40, and the contact part 72 of the semiconductor device 104 are different from those of the semiconductor device 100 shown in FIG. 1. Specifically, the second electrodes 12 of the four unit element regions AA are formed as one conductive film 12*c* and are continuous and electrically connected to each other. Compared to the semiconductor device 100, the conductive film 40 is not formed in the partitioning region DA between two adjacent unit element regions AA; instead, the conductive film 12*c* is formed. The surface area of the conductive film forming the second electrode 12 can be further increased thereby, and the resistance (e.g., the source wiring resistance) of the second electrode 12 can be further reduced. Gate contacts are not located below the conductive film 12*c*. In one unit element region AA, the gate contacts are located at one side in the second direction D2.

Second Embodiment

Figure 13:
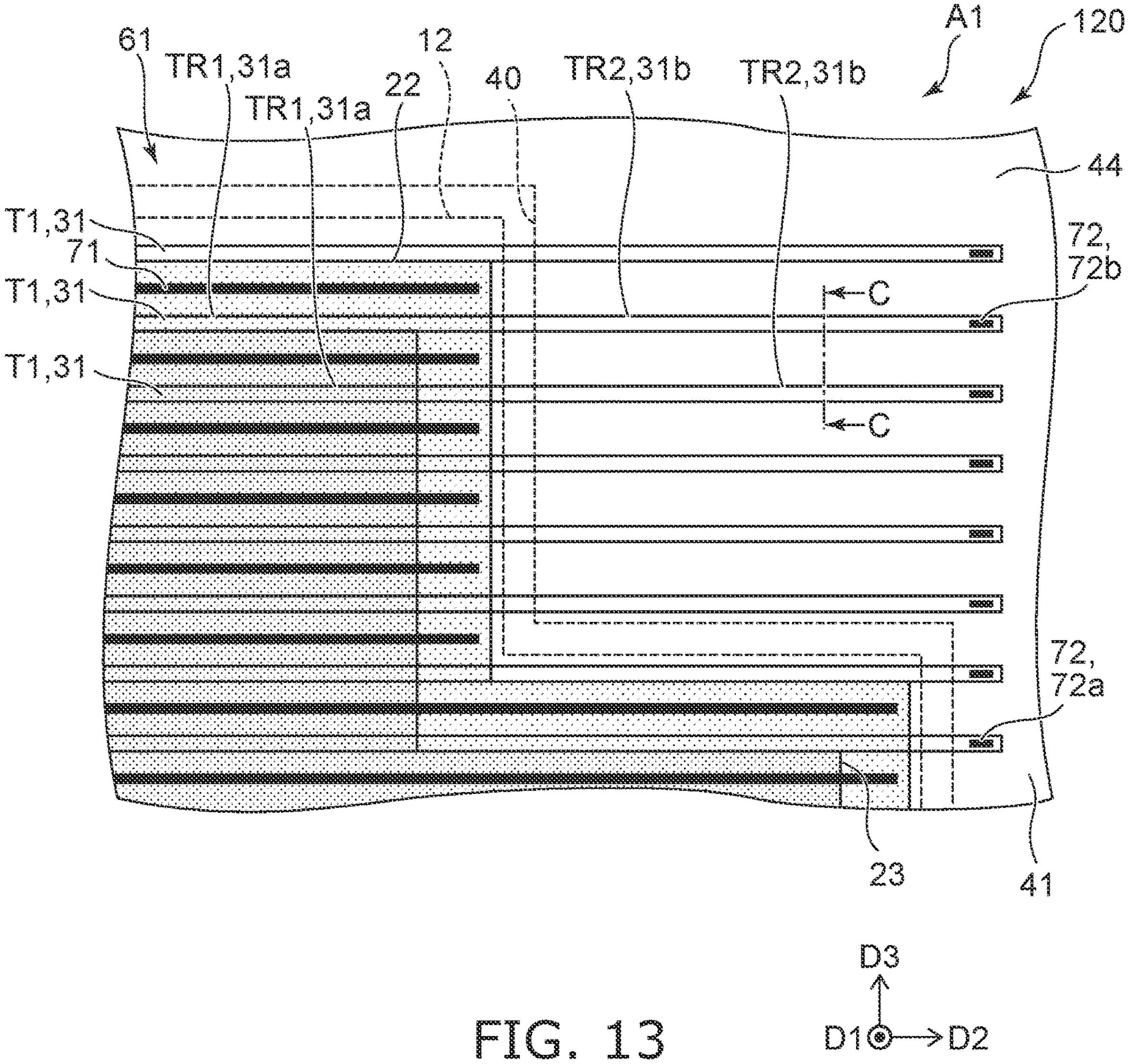
FIG. 13 is a schematic plan view illustrating a semiconductor device according to a second embodiment.

FIG. 13 is a schematic plan view illustrating a semiconductor device according to a second embodiment.

Figure 14:
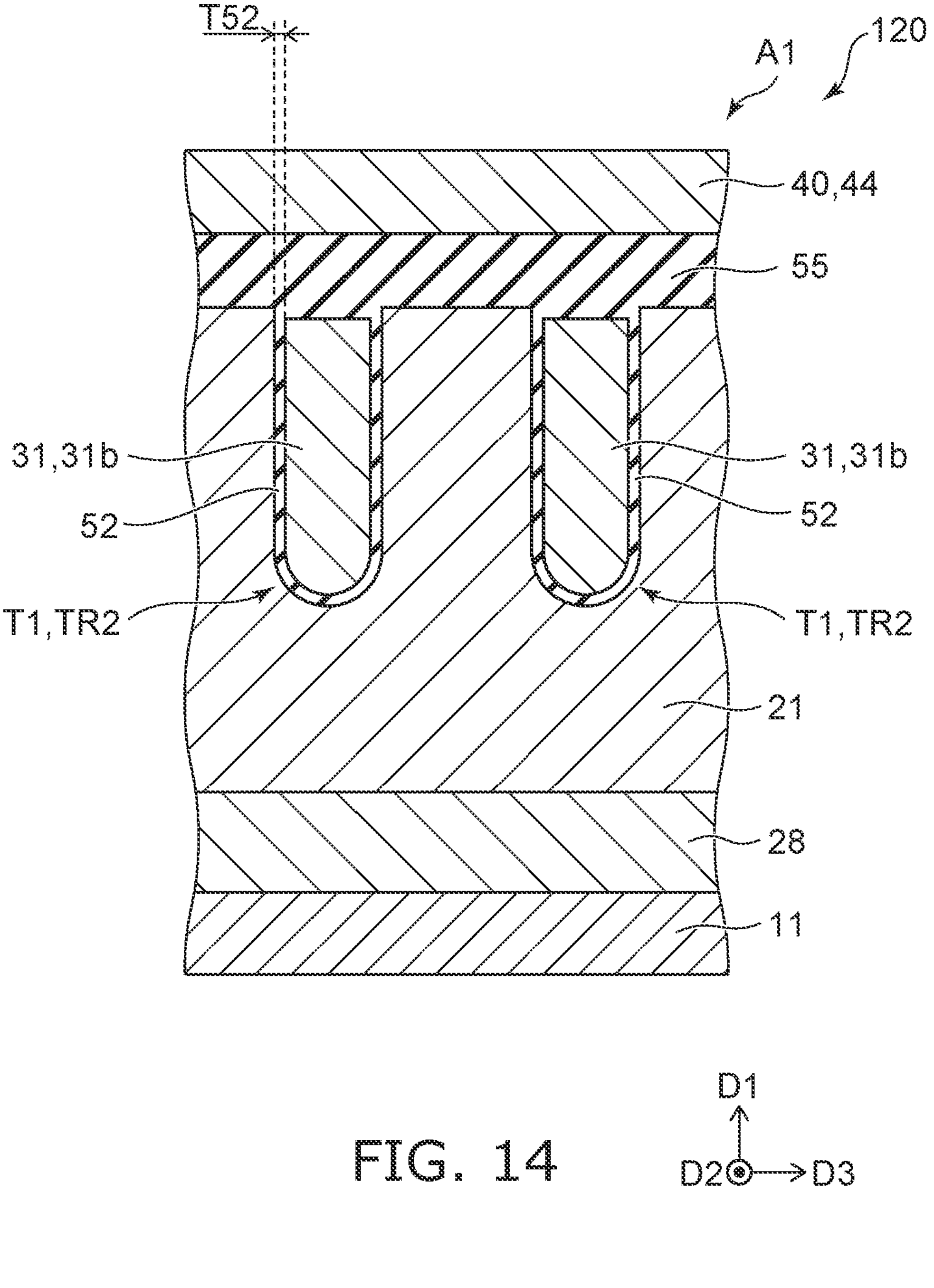
FIG. 14 is a schematic cross-sectional view illustrating the semiconductor device according to the second embodiment.

The configuration at the conductive region 44 vicinity of the first unit element region A1 illustrated in FIG. 14 of the semiconductor device 120 according to the second embodiment is different from that of the semiconductor device 100. Otherwise, a description similar to that of the semiconductor device 100 is applicable to the configuration of the semiconductor device 120.

FIG. 14 is a schematic cross-sectional view illustrating the semiconductor device according to the second embodiment.

FIG. 14 illustrates a line C-C cross section shown in FIG. 13. As illustrated in FIGS. 13 and 14, the fourth semiconductor region 24 is not included in the semiconductor device 120. In the semiconductor device 120, the second semiconductor region 22 is not located below the conductive film 40 that includes the conductive region 44. The first semiconductor region 21 contacts the side and lower surfaces of the second trench part TR2 located below the conductive film 40. Instead of the first insulating film 51 shown in FIG. 5, a second insulating film 52 is located at the inner wall of the second trench part TR2. In other words, the second insulating film 52 is located between the first semiconductor region 21 and the second portion 31*b* of the first conductive part 31. The second portion 31*b* faces the side surface of the first semiconductor region 21 via the second insulating film 52. The material of the second insulating film 52 may be similar to the first insulating film 51.

A thickness T52 of the second insulating film 52 illustrated in FIG. 14 is greater than a thickness T51 of the first insulating film 51 (see FIG. 3). For example, breakdown of the second insulating film 52 can be suppressed thereby even when the potential of the first semiconductor region 21 rises due to avalanche. Thickening the second insulating film 52 makes it unnecessary to provide the second semiconductor region 22 and the fourth semiconductor region 24 below the conductive region 44.

Third Embodiment

Figure 15:
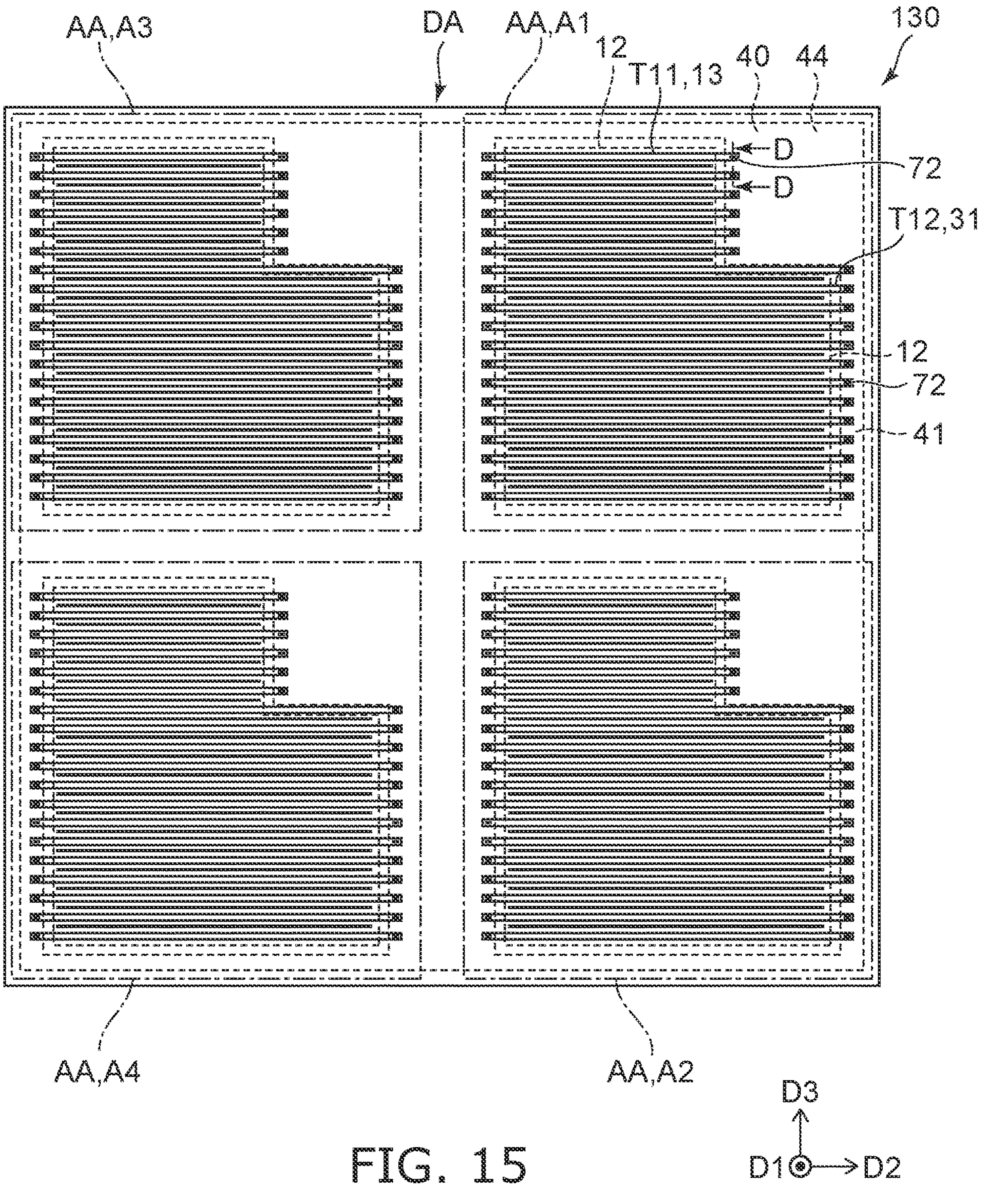
FIG. 15 is a schematic plan view illustrating a semiconductor device according to a third embodiment.

FIG. 15 is a schematic plan view illustrating a semiconductor device according to a third embodiment.

Figure 16:
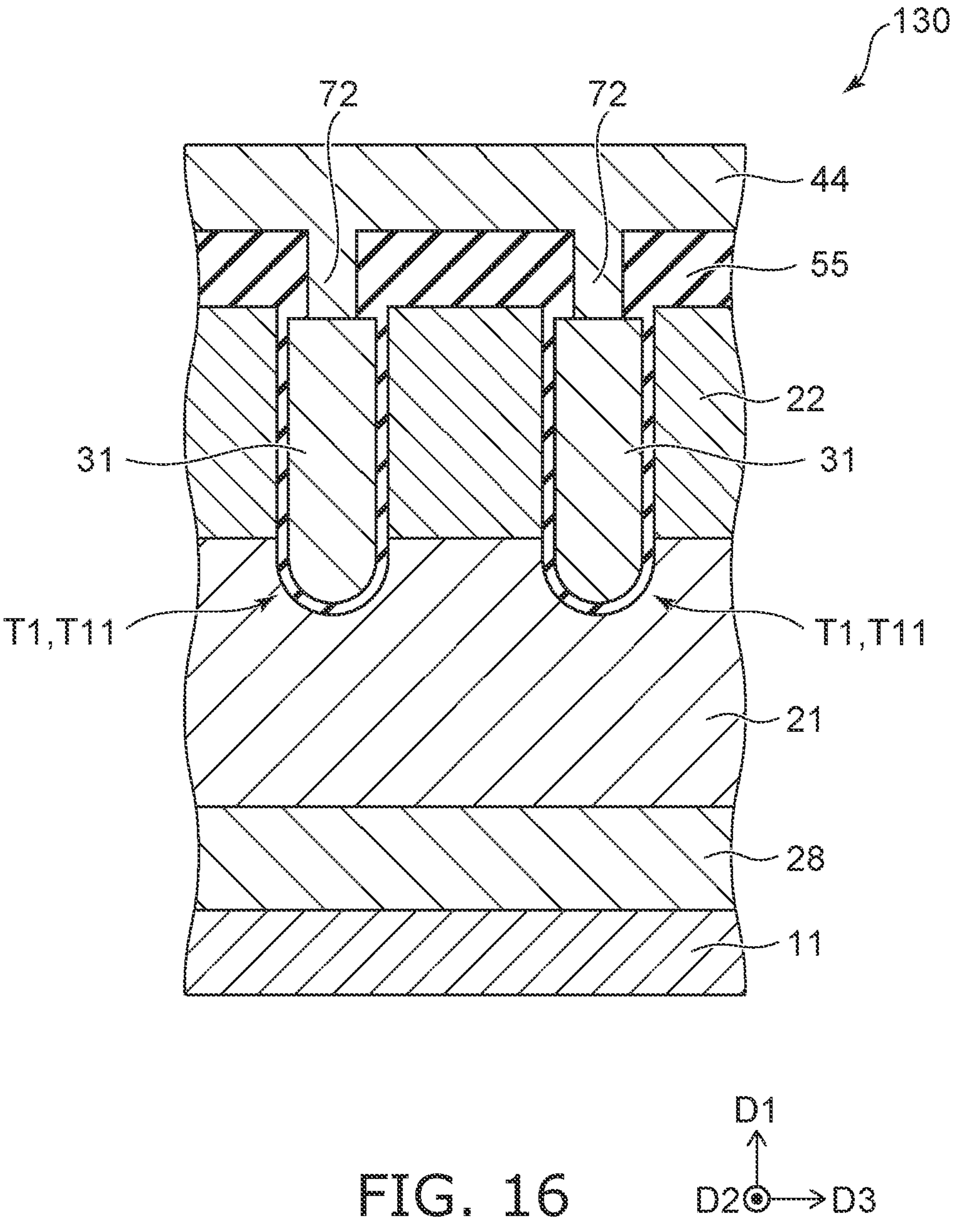
FIG. 16 is a schematic cross-sectional view illustrating the semiconductor device according to the third embodiment.

FIG. 16 is a schematic cross-sectional view illustrating the semiconductor device according to the third embodiment.

FIG. 16 shows a line D-D cross section shown in FIG. 15. The first to fourth unit element regions A1 to A4 are included in the semiconductor device 130 according to the third embodiment as well. In the semiconductor device 130, each of the second to fourth unit element regions A2 to A4 has a configuration similar to that of the first unit element region A1. Also, the configurations of the first trench T1, the first conductive part 31, and the contact part 72 below the conductive region 44 of the first unit element region A1 of the semiconductor device 130 are different from those of the first unit element region A1 of the semiconductor device 100. Otherwise, a description similar to that of the semiconductor device 100 is applicable to the configuration of the semiconductor device 130.

In the semiconductor device 130 as illustrated in FIG. 15, the multiple first trenches T1 include trenches T11 and trenches T12. The trenches T11 are the trenches having end portions located below the conductive region 44. The trenches T12 are the trenches other than the trenches T11.

The trench T11 does not extend to the center of the conductive region 44. The trench T11 is shorter than the trench T12 in the second direction D2. The end portion of the trench T11 is positioned below the end portion of the conductive region 44 at the second electrode 12 side. Therefore, the first conductive part 31 that is located in the trench T11 does not extend to the center of the conductive region 44. In the second direction D2, the first conductive part 31 that is located inside the trench T11 is shorter than the first conductive part 31 located inside the trench T12. The contact part 72 that connects the conductive region 44 and the first conductive part 31 in the trench T11 is positioned below the end portion of the conductive region 44 at the second electrode 12 side.

In the semiconductor device 130, the common pattern included in the multiple unit element regions AA may be the pattern of the third semiconductor region 23, the pattern of the second electrode 12, the pattern of the first wiring part 41, and the pattern of the conductive region 44.

For example, the number, positions, and shapes of the third semiconductor regions 23 in the first unit element region A1 are common with the number, positions, and shapes of the third semiconductor regions 23 in the second unit element region A2. For example, the number, positions, and shapes of the second electrodes 12 in the first unit element region A1 are common with the number, positions, and shapes of the second electrodes 12 in the second unit element region A2.

For example, the number, positions, and shapes of the first wiring parts 41 in the first unit element region A1 are common with the number, positions, and shapes of the first wiring parts 41 in the second unit element region A2.

For example, the number, positions, and shapes of the conductive regions 44 in the first unit element region A1 are common with the number, positions, and shapes of the conductive regions 44 in the second unit element region A2.

Thus, in the semiconductor device 130, each unit element region AA includes the first wiring part 41 and the conductive region 44. In each unit element region AA, the conductive film that includes the first wiring part 41 and the conductive region 44 surrounds the second electrode 12. The patterns of the second electrode 12, the first wiring part 41, and the conductive region 44 are common to the multiple unit element regions AA. Thereby, for example, the processes up to the metal process (e.g., the process of FIG. 8E) can be used commonly even when manufacturing semiconductor devices of different sizes. Accordingly, the productivity can be further improved. Because the same pattern of unit element region AA is repeatedly arranged, singularities in the layout do not easily occur. Thereby, for example, breakdown voltage defects, breakdown, etc., do not easily occur at a singularity.

Fourth Embodiment

Figure 17:
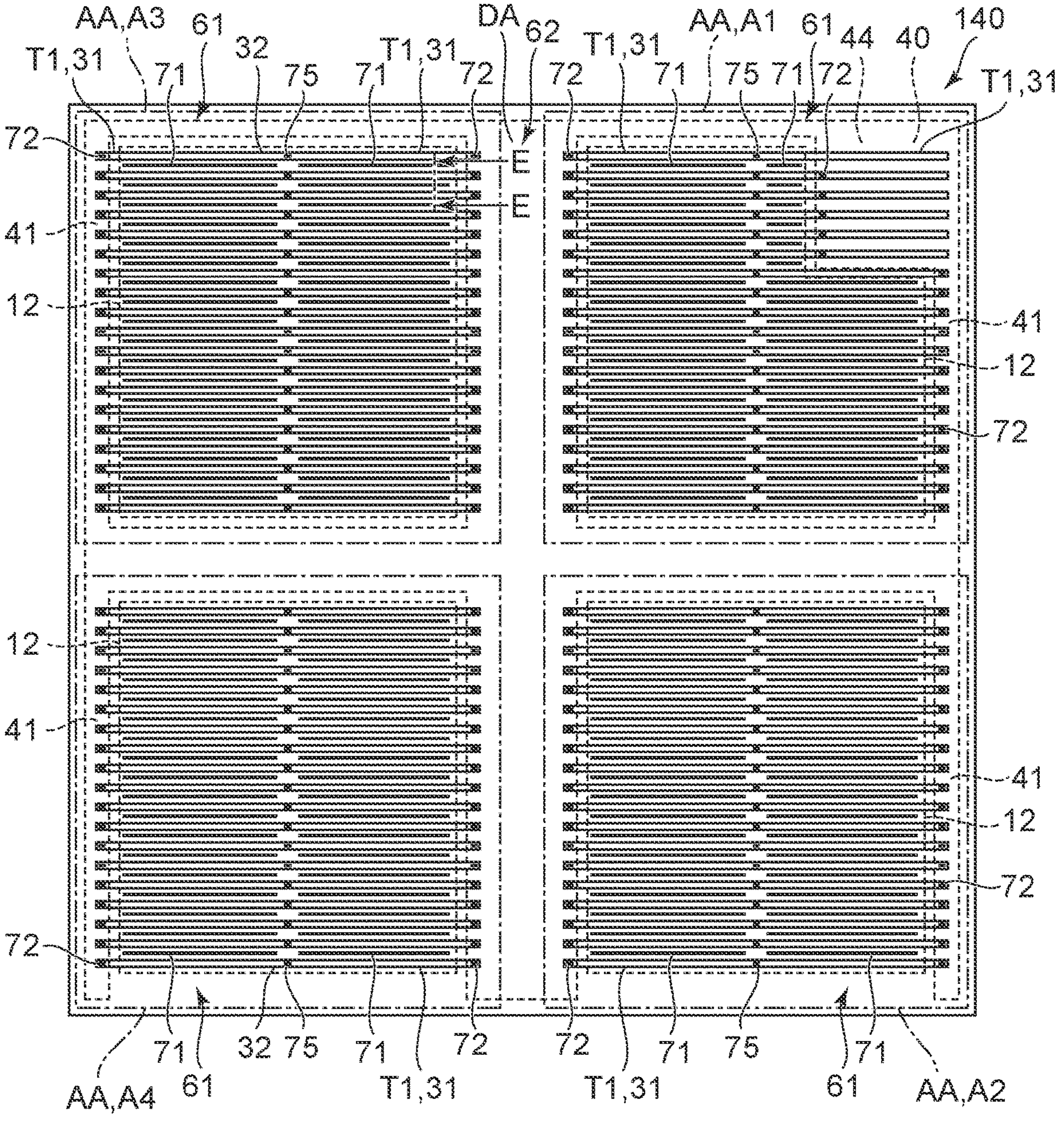
FIG. 17 is a schematic plan view illustrating a semiconductor device according to a fourth embodiment.

FIG. 17 is a schematic plan view illustrating a semiconductor device according to a fourth embodiment.

Figure 18:
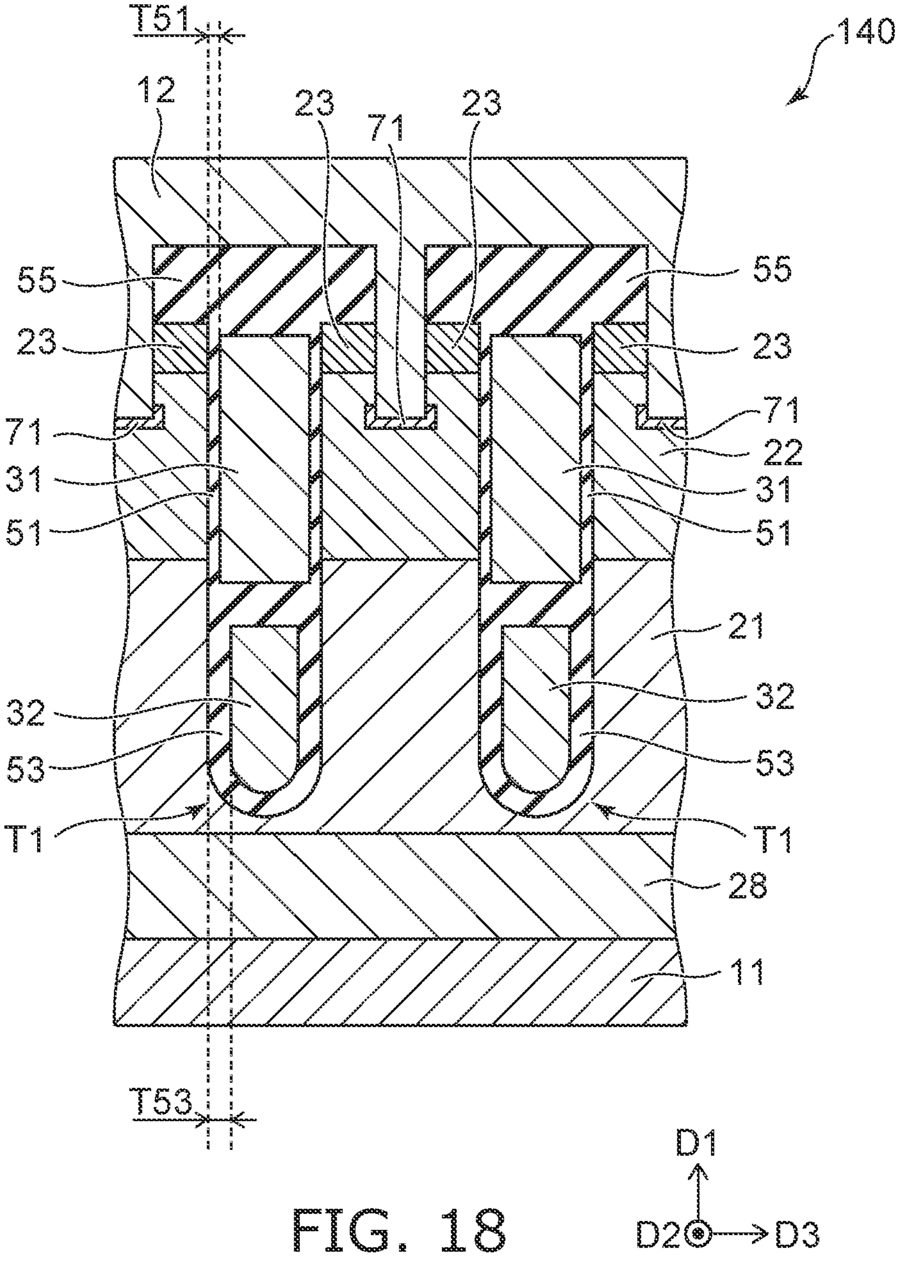
FIG. 18 is a schematic cross-sectional view illustrating the semiconductor device according to the fourth embodiment.

Compared to the semiconductor device 100, the semiconductor device 140 according to the fourth embodiment includes a second conductive part 32 (a field plate (FP)), a contact part 75 (a FP contact), and an insulating film 53 (a FP insulating film; see FIG. 18). Accordingly, compared to the semiconductor device 100, the contact part 71 and the first conductive part 31 of the semiconductor device 140 are subdivided in the second direction D2. As described below, the configuration inside the trench T1 and the arrangement of the contact part 72 below the conductive region 44 are different from those of the semiconductor device 100. The fourth semiconductor region 24 may not be included in the semiconductor device 140. According to the configuration described above, the arrangement of the second and third semiconductor regions 22 and 23 may be modified as appropriate. Otherwise, a description similar to that of the semiconductor device 100 is applicable to the configuration of the semiconductor device 140.

As illustrated in FIG. 17, each unit element region AA includes the multiple second conductive parts 32 and the multiple contact parts 75. The multiple second conductive parts 32 are located inside the multiple first trenches T1. The multiple second conductive parts 32 are arranged in the third direction D3. The second conductive parts 32 extend in the second direction D2.

The multiple contact parts 75 are located on the multiple first trenches T1. The contact parts 75 are positioned at the central portions of the first trenches T1 in the second direction D2. For example, the contact parts 75 are positioned between the second electrode 12 and the second conductive parts 32 in the vertical direction and electrically connect the second electrode 12 and the second conductive parts 32. For example, the contact parts 75 are continuous with the second electrode 12, extend downward from the second electrode 12, and contact the second conductive parts 32. The contact parts 75 may be portions of a conductive film forming the second electrode 12.

In each unit element region AA, the multiple contact parts 75 are arranged in the third direction D3. The first conductive parts 31 and the contact parts 71 are not located in the central portion of the unit element region AA in which the contact part 75 are arranged.

FIG. 18 is a schematic cross-sectional view illustrating the semiconductor device according to the fourth embodiment.

FIG. 18 shows a line E-E cross section shown in FIG. 17. As illustrated in FIG. 18, the insulating film 53 is located at the inner wall (the bottom portion and the inner surface) of the first trench T1. The second conductive part 32 includes a portion facing the side surface of the first semiconductor region 21 via the insulating film 53. In the first trench T1, the first conductive part 31 and the first insulating film 51 are located on the second conductive part 32 and the insulating film 53. For example, a thickness T53 of the insulating film 53 is greater than the thickness T51 of the first insulating film 51.

Figure 19:
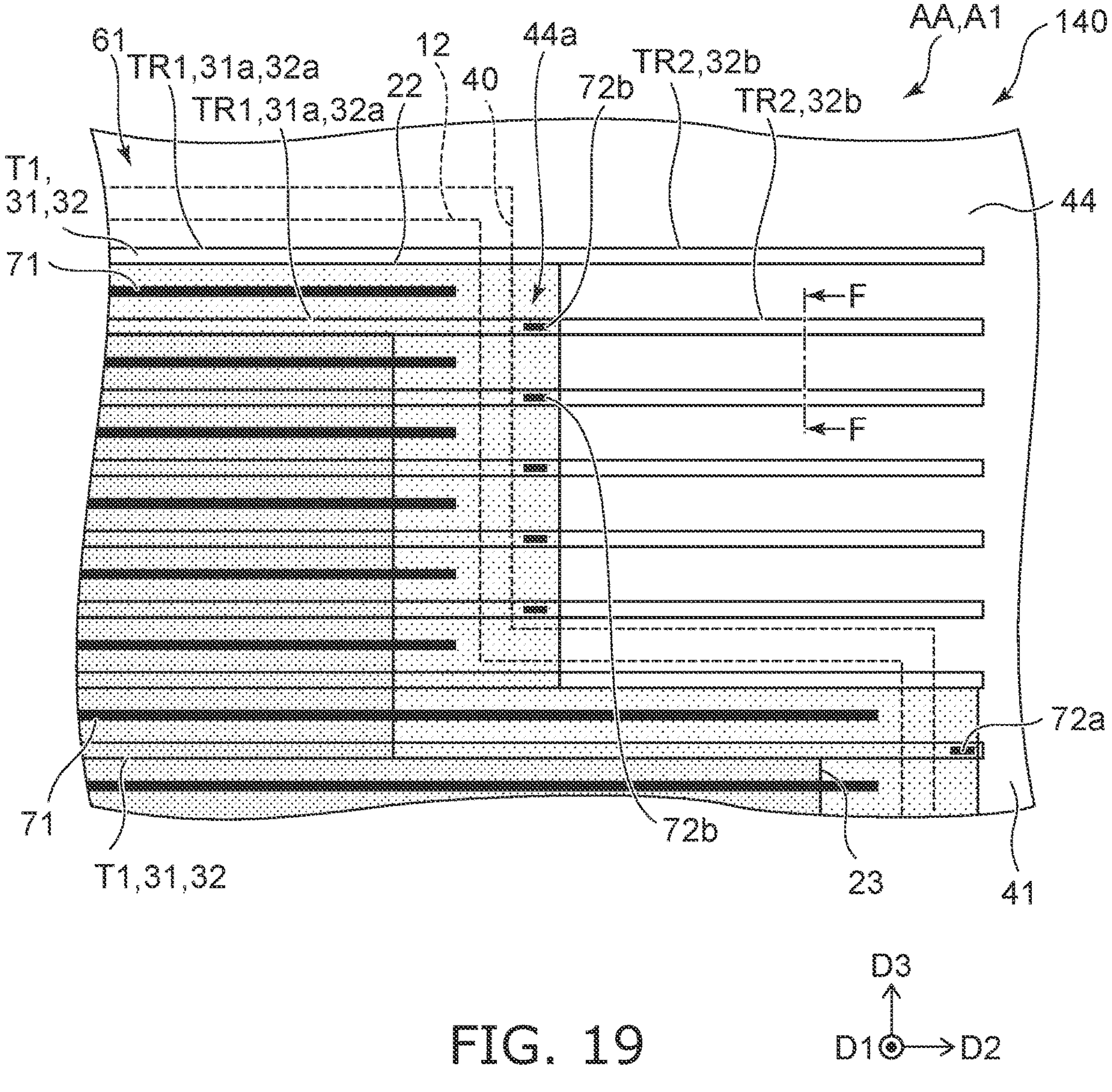
FIG. 19 is a schematic plan view illustrating the semiconductor device according to the fourth embodiment.

FIG. 19 is a schematic plan view illustrating the semiconductor device according to the fourth embodiment.

FIG. 19 is an enlarged illustration of the vicinity of the conductive region 44 illustrated in FIG. 17. The second conductive part 32 includes a first FP portion 32*a* and a second FP portion 32*b*. The first FP portion 32*a* is located below the second electrode 12 and located inside the first trench part TR1. The second FP portion 32*b* extends in the second direction D2 from the first FP portion 32*a*, is located below the conductive region 44, and is located inside the second trench part TR2. Similarly to FIG. 18, the first conductive part 31, the second conductive part 32 (the first FP portion 32*a*), the first insulating film 51, and the insulating film 53 are located inside the first trench part TR1.

The contact part 72*b* is located under an end portion region 44*a* of the conductive region 44. The end portion region 44*a* is the end portion in the second direction D2 of the conductive region 44 that is at the second electrode 12 side. That is, in the example, the contact part 72*b* is not arranged with the contact part 72*a* in the third direction D3. The first conductive part 31 that is connected to the contact part 72*b* is shorter than the first conductive part 31 connected to the contact part 72*a*. The second semiconductor region 22 extends from a region below the second electrode 12 to a region below the end portion region 44*a*.

To increase the breakdown voltage of the FP structure, for example, the second semiconductor region 22 (a base layer) is positioned further inward than the trench tip and further outward than the contact part 72*a*.

Figure 20:
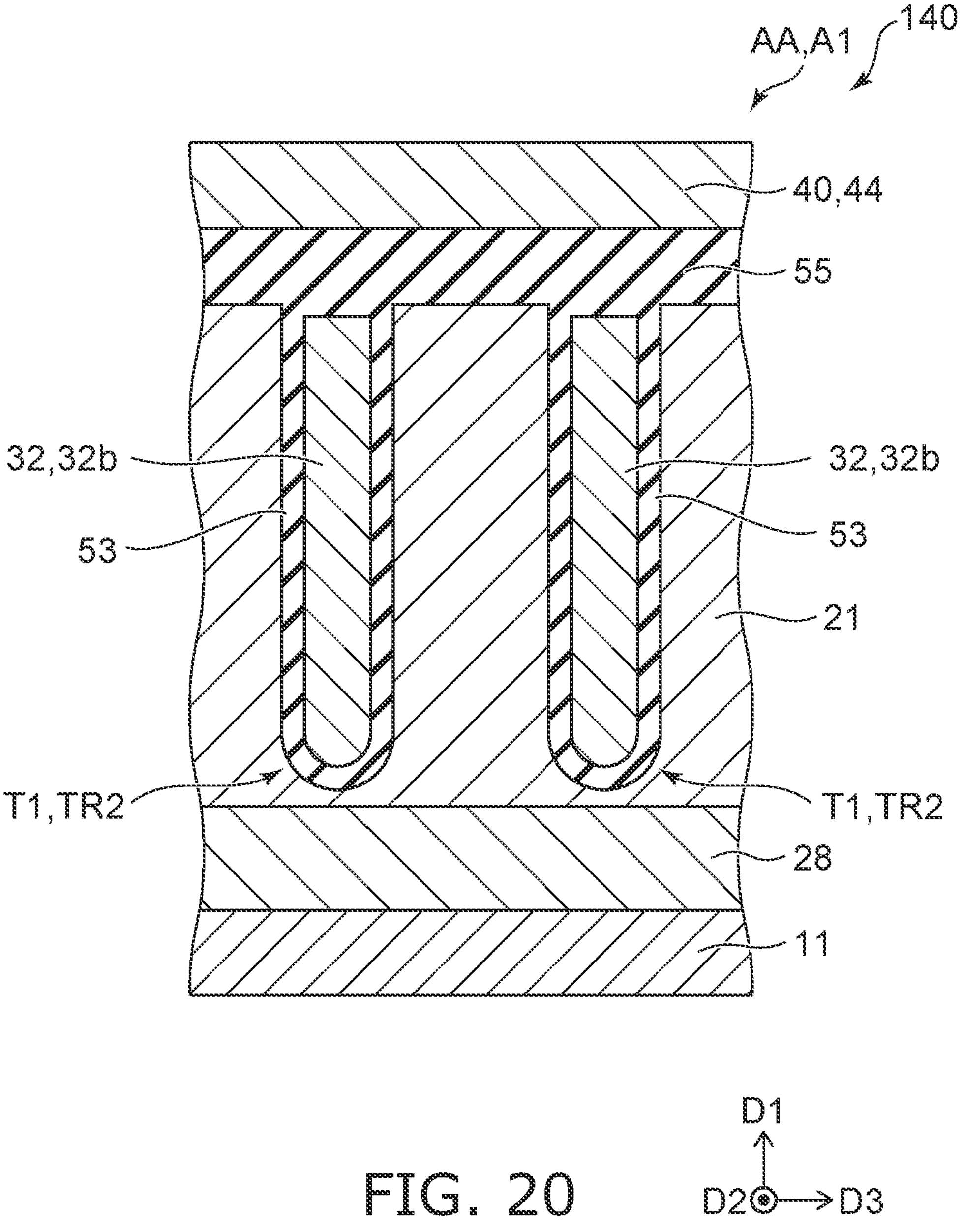
FIG. 20 is a schematic cross-sectional view illustrating the semiconductor device according to the fourth embodiment.

FIG. 20 is a schematic cross-sectional view illustrating the semiconductor device according to the fourth embodiment.

FIG. 20 shows a line F-F cross section shown in FIG. 19. The first conductive part 31 and the first insulating film 51 are not located in the second trench part TR2 below the conductive region 44. The insulating film 53 and the second FP portion 32*b* of the second conductive part 32 are located in the second trench part TR2. In the example, compared to the example of FIG. 5, the second semiconductor region 22 and the fourth semiconductor region 24 are not located below the conductive region 44. However, similarly to the example of FIG. 5, the second semiconductor region 22 and the fourth semiconductor region 24 also may be located below the conductive region 44.

The material of the second conductive part 32 may be similar to the first conductive part 31. The material of the insulating film 53 may be similar to the first insulating film 51.

By including the second conductive part 32, for example, the depletion layer can spread easily in the first semiconductor region 21, the electric field can be relaxed, and the breakdown voltage of the semiconductor device 140 can be increased. As described above, the second FP portion 32*b* is located in the second trench part TR2 below the conductive region 44, but the first conductive part 31 is not included. Therefore, the insulating film 53 is located in the second trench part TR2, but the first insulating film 51 is not included. Breakdown of the first insulating film 51 when avalanche breakdown occurs below the conductive region 44 can be suppressed thereby.

Fifth Embodiment

Figure 21:
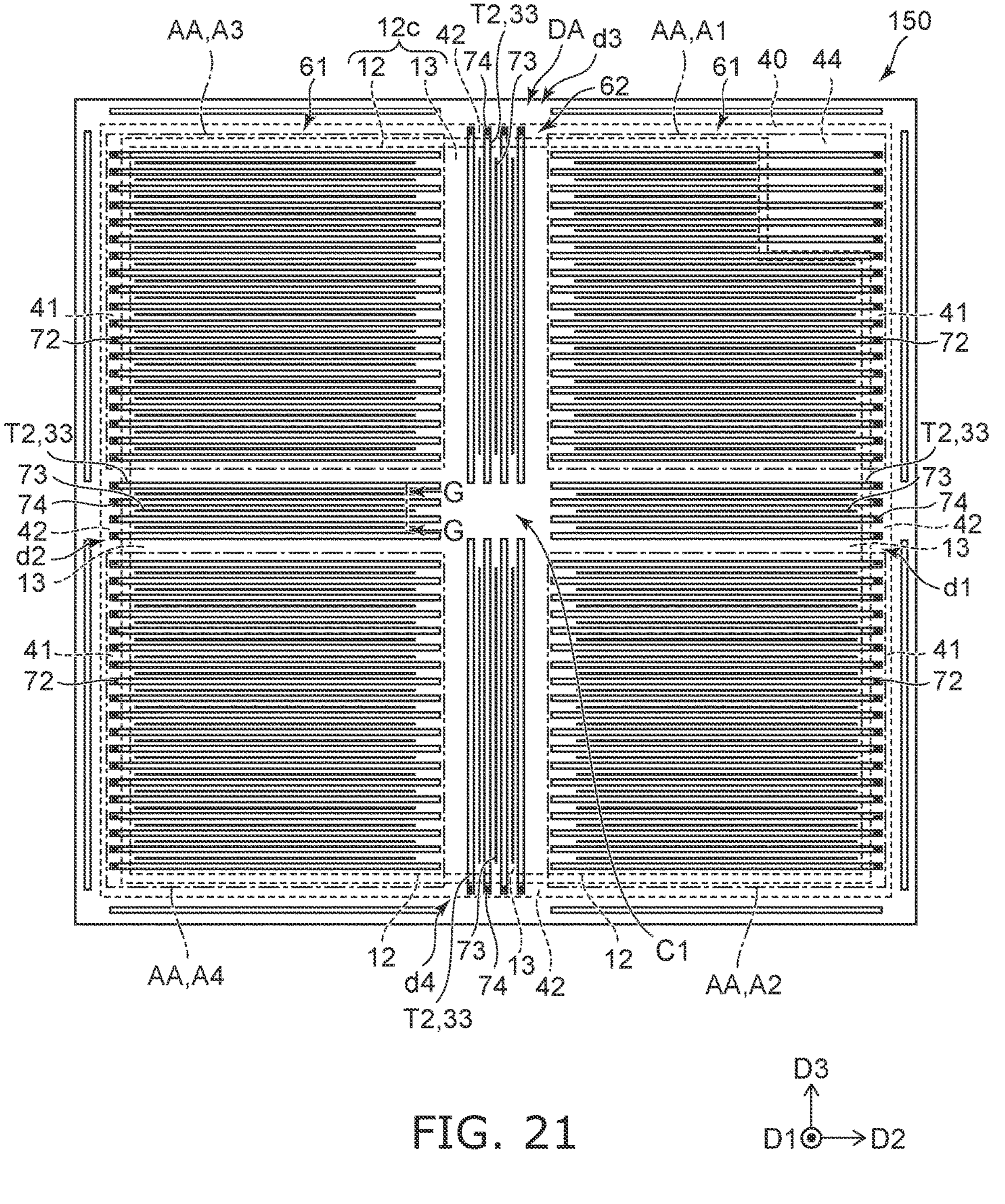
FIG. 21 is a schematic plan view illustrating a semiconductor device according to a fifth embodiment.

FIG. 21 is a schematic plan view illustrating a semiconductor device according to a fifth embodiment.

The configurations of the conductive film 40 and the partitioning region DA of the semiconductor device 150 illustrated in FIG. 21 are different from those of the semiconductor device 104 shown in FIG. 12. In the example, transistors are located in the partitioning region DA. The multiple second electrodes 12 are formed as one conductive film 12*c* and are continuous and electrically connected to each other. The conductive film 40 that includes the first wiring part 41 and the conductive region 44 surround the outer perimeter (e.g., the entire perimeter) of the conductive film 12*c*. Otherwise, a description similar to that of the semiconductor device 104 is applicable to the configuration of the semiconductor device 150.

Figure 22:
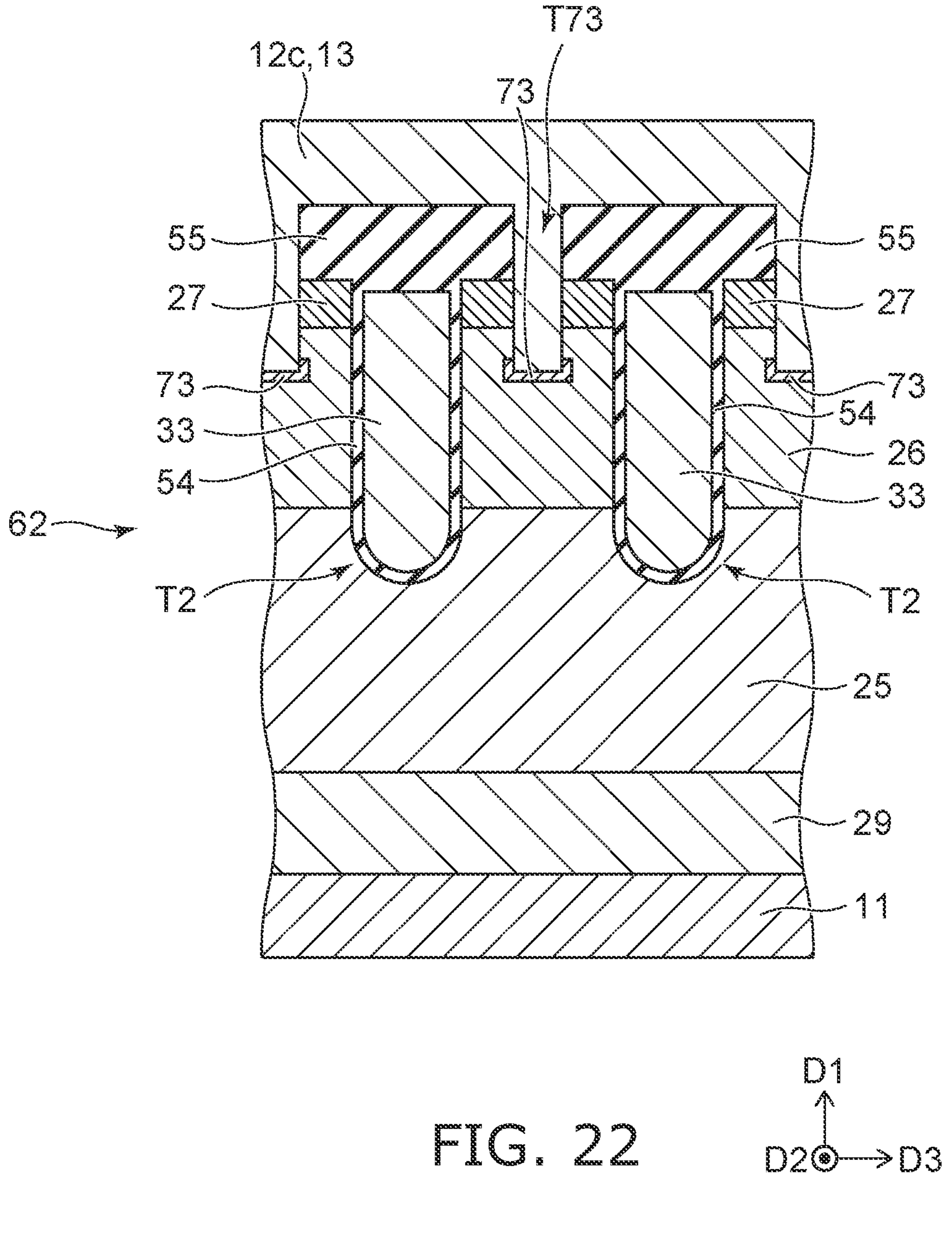
FIG. 22 is a schematic cross-sectional view illustrating the semiconductor device according to the fifth embodiment.

FIG. 22 is a schematic cross-sectional view illustrating the semiconductor device according to the fifth embodiment.

FIG. 22 shows a line G-G cross section illustrated in FIG. 21. As illustrated in FIG. 22, the second semiconductor part 62 of the partitioning region DA is located on the first electrode 11. Transistors similar to those of the unit element region AA are located in the partitioning region DA. In other words, the second semiconductor part 62 includes a fifth semiconductor region 25 (a drift region), a sixth semiconductor region 26 (a base region), multiple seventh semiconductor regions 27 (source regions), multiple second trenches T2, and multiple contact parts 73. The partitioning region DA includes multiple third conductive parts 33 (gate electrodes), multiple insulating films 54 (gate insulating films), and a third electrode 13 (a source electrode).

The fifth semiconductor region 25 is located above the first electrode 11 with a semiconductor region 29 interposed. The fifth semiconductor region 25 and the semiconductor region 29 are of the first conductivity type. The first-conductivity-type impurity concentration of the fifth semiconductor region 25 is less than the first-conductivity-type impurity concentration of the semiconductor region 29. The sixth semiconductor region 26 is located on a portion of the fifth semiconductor region 25. The sixth semiconductor region 26 is of the second conductivity type. The seventh semiconductor region 27 is located on a portion of the sixth semiconductor region 26. The seventh semiconductor region 27 is of the first conductivity type. The first-conductivity-type impurity concentration of the seventh semiconductor region 27 is greater than the first-conductivity-type impurity concentration of the fifth semiconductor region 25.

The fifth semiconductor region 25 and the semiconductor region 29 of the partitioning region DA may be portions of the same semiconductor layer that is continuous with the first semiconductor region 21 and the semiconductor region 28 of the unit element region AA. On the other hand, the sixth semiconductor region 26 may not be continuous with the second semiconductor region 22. That is, a semiconductor region of the first conductivity type (e.g., a portion of the first semiconductor region 21 or the fifth semiconductor region 25) may be located between the sixth semiconductor region 26 and the second semiconductor region 22. However, the sixth semiconductor region 26 and the second semiconductor region 22 may be continuous.

The multiple contact parts 73 are located on a portion of the sixth semiconductor region 26. More specifically, the contact part 73 is located at the bottom portion of a trench T73 located in the sixth and seventh semiconductor regions 26 and 27. The contact part 73 is of the second conductivity type. The second-conductivity-type impurity concentration of the contact part 73 is greater than the second-conductivity-type impurity concentration of the sixth semiconductor region 26. The third conductive part 33 is located on a portion of the fifth semiconductor region 25. The third conductive part 33 includes a portion that faces the side surface of the sixth semiconductor region 26 via the insulating film 54. The second trench T2 is located in the second semiconductor part 62 and extends along the surface of the second semiconductor part 62. The insulating film 54 is located at the inner wall of the second trench T2. The multiple third conductive parts 33 are located inside the multiple second trenches T2. The material of the insulating film 54 may be similar to that of the first insulating film 51.

The third electrode 13 is located above the third conductive part 33, the sixth semiconductor region 26, and the seventh semiconductor region 27. The third electrode 13 is electrically connected with the sixth and seventh semiconductor regions 26 and 27. The contact part 73 is located between the third electrode 13 and the sixth semiconductor region 26 and contacts the third electrode 13 and the sixth semiconductor region 26. The contact part 73 electrically connects the third electrode 13 to the sixth semiconductor region 26. The insulating film 55 is located between the third conductive part 33 and the third electrode 13. The third electrode 13 is continuous with the second electrode 12 of the unit element region AA and electrically connected to the second electrode 12. The third electrode 13 may be a portion of the conductive film 12*c* that includes the second electrode 12.

The regions between the unit element regions AA adjacent to each other (regions d1 to d4) may have configurations similar to FIG. 22. However, the multiple second trenches T2, the multiple third conductive parts 33, the multiple contact parts 73 (the trenches T73), and the multiple seventh semiconductor regions 27 extend along the outer perimeters (the sides) of the adjacent unit element regions AA. Specifically, for example, as illustrated in FIG. 21, the second trench T2, the third conductive part 33, and the contact part 73 extend in the second direction D2 in the partitioning region DA between the first unit element region A1 and the second unit element region A2 (the region d1) and between the third unit element region A3 and the fourth unit element region A4 (the region d2). For example, the second trench T2, the third conductive part 33, and the contact part 73 extend in the third direction D3 in the partitioning region DA between the first unit element region A1 and the third unit element region A3 (the region d3) and between the second unit element region A2 and the fourth unit element region A4 (the region d4). The second trench T2, the third conductive part 33, and the contact part 73 may not be provided at an intersection Cl of the lattice shape of the partitioning region DA (between the region d1 and the region d2 and between the region d3 and the region d4 adjacent to the corners of the four unit element regions AA).

As illustrated in FIG. 21, the partitioning region DA further includes multiple contact parts 74 (gate contacts) and a second wiring part 42 (a gate wiring). The second wiring part 42 is located above the second semiconductor part 62. The second wiring part 42 is a portion of the conductive film 40 that includes the first wiring part 41, and is continuous with the first wiring part 41. The multiple third conductive parts 33 are electrically connected with the second wiring part 42 via the multiple contact parts 74.

The first wiring part 41 and the second wiring part 42 (and the conductive region 44) are positioned at the outer perimeter portions of the multiple unit element regions AA and the partitioning region DA. The conductive film 40 (the first wiring part 41, the second wiring part 42, and the conductive region 44) surrounds the conductive film 12*c* (the second electrode 12 and the third electrode 13).

The contact part 74 is located on one end portion in the extension direction of each third conductive part 33. For example, the contact part 74 extends downward continuously from the conductive film 40 that includes the second wiring part 42. The contact part 74 may be a portion of the conductive film 40. For example, the contact part 74 extends through the insulating film 55 on the third conductive part 33 and contacts the third conductive part 33. Thereby, the contact part 74 electrically connects the third conductive part 33 to the second wiring part 42. The contact parts 74 that are located in the first and second regions d1 and d2 are arranged in the third direction D3 with the multiple contact parts 72.

Thus, in the semiconductor device 150, elements (transistors) are located in the partitioning region DA as well. The partitioning region DA can be effectively utilized thereby, and the ineffective area can be reduced.

The first wiring part 41 and the second wiring part 42 are positioned at the outer perimeters of the multiple unit element regions AA and the partitioning region DA. The contacts for the elements in the partitioning region DA are easily formed thereby.

The second trench T2, the third conductive part 33, and the contact part 73 extend along the outer perimeters of the adjacent multiple unit element regions AA. The second trench T2, the third conductive part 33, and the contact part 73 are not located at the intersection of the lattice-shaped partitioning region DA. Thereby, the cutting direction and the second trench T2 do not orthogonally cross even when the size of the semiconductor device to be manufactured is modified and the partitioning region DA shown in FIG. 21 is selected as the cutting position. Therefore, the stability of the cutting can be improved.

Modification 5

Figure 23:
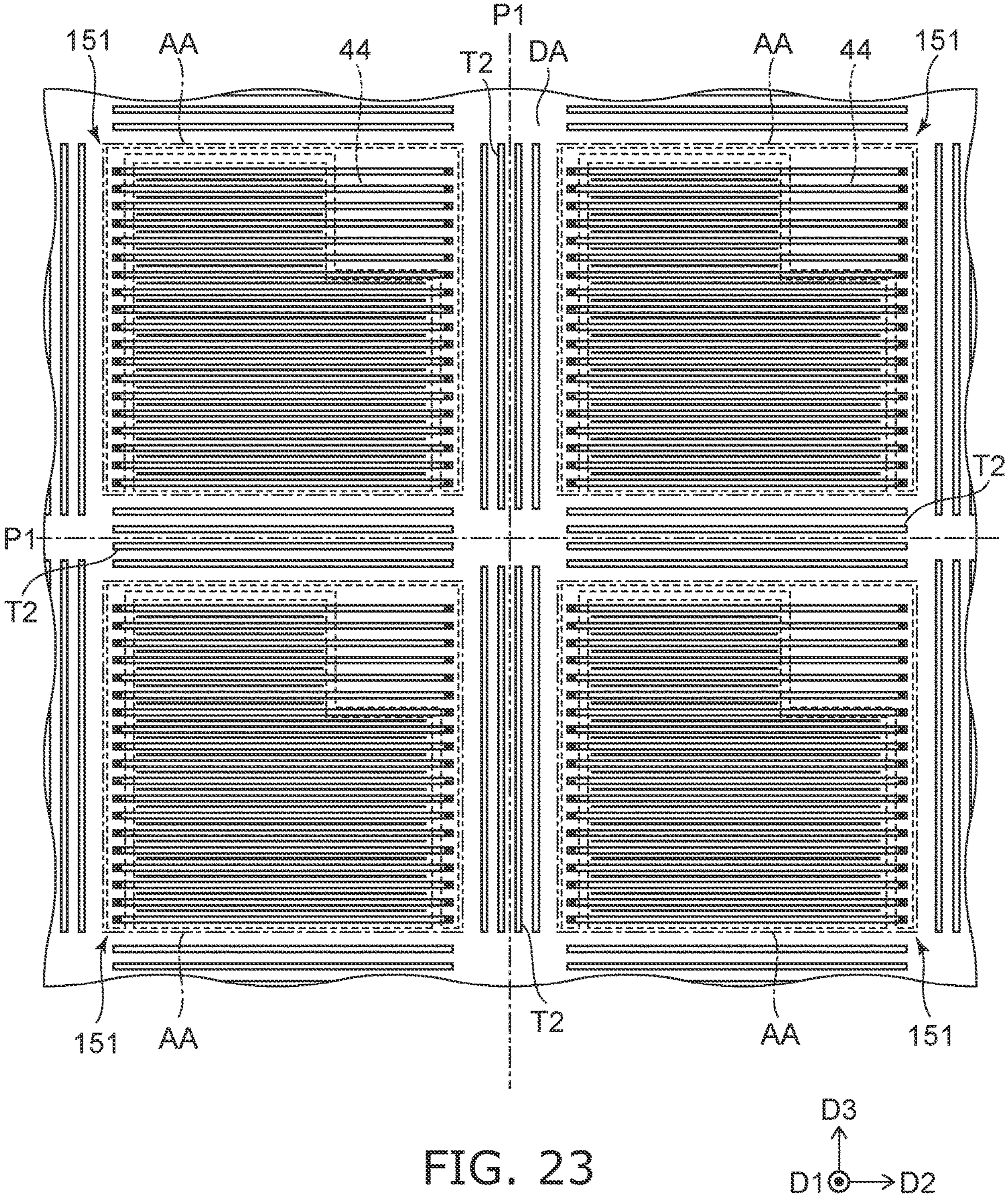
FIG. 23 is a schematic plan view illustrating a modification of the semiconductor device according to the fifth embodiment.

FIG. 23 is a schematic plan view illustrating a modification of the semiconductor device according to the fifth embodiment.

FIG. 23 illustrates the wafer Wf before the dicing process. The wafer Wf includes the partitioning region DA and the multiple unit element regions AA used to form the semiconductor devices 151. The number of the unit element regions AA included in one semiconductor device 151 is one. The semiconductor devices 151 are manufactured by cutting the partitioning region DA at the cutting positions P1 illustrated in FIG. 23.

For example, each unit element region AA is similar to the unit element region AA of the semiconductor device 101 shown in FIG. 9. In other words, the conductive region 44 is located in each unit element region AA. Also, similarly to the semiconductor device 150, the second trenches T2 are provided in the partitioning region DA. The second trenches T2 extend along the cutting positions P1. In the semiconductor device 151 that includes one unit element region AA, the contact parts 73 and the contact parts 74 may not be included in the partitioning region DA.

Sixth Embodiment

Figure 24:
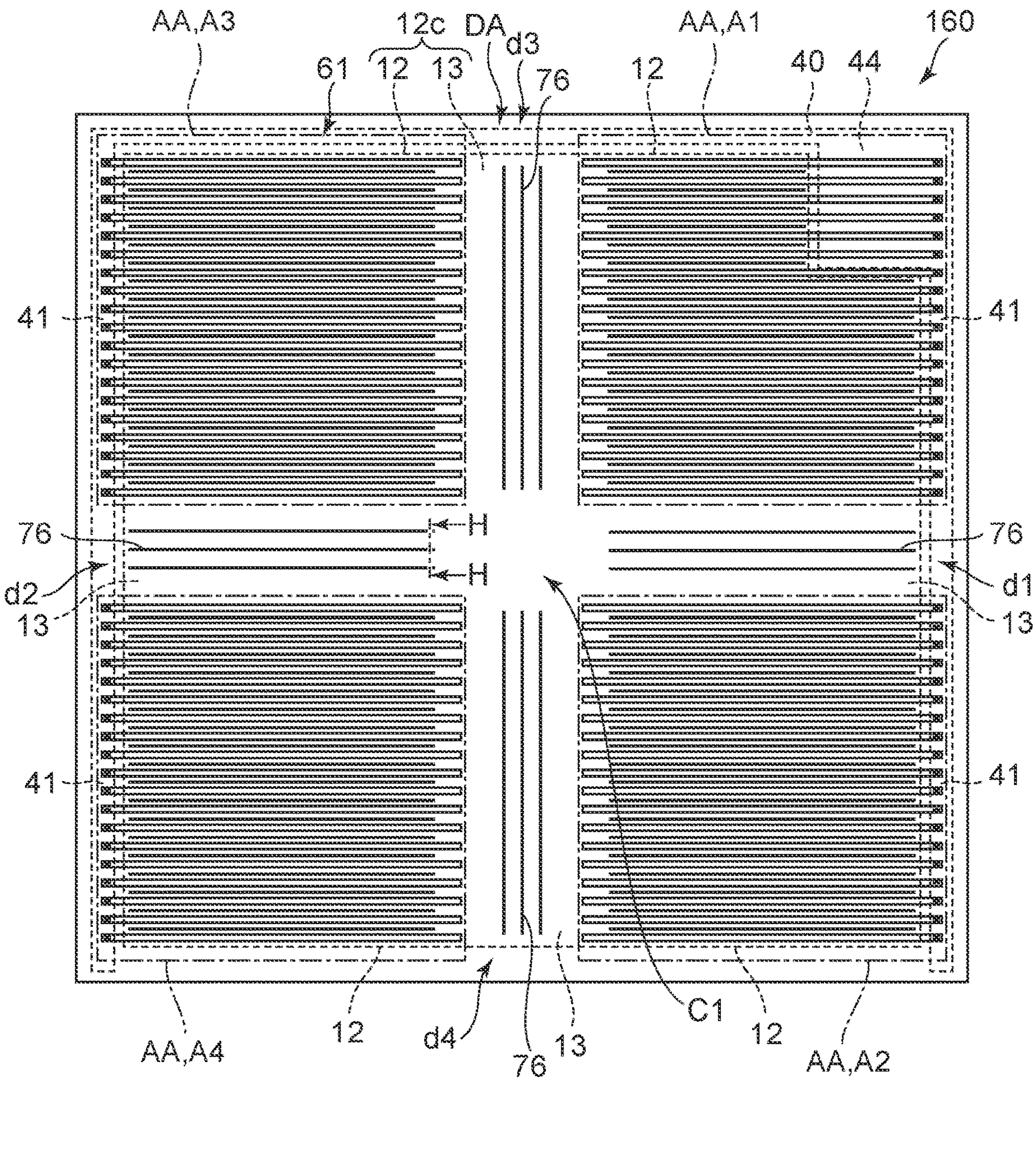
FIG. 24 is a schematic plan view illustrating a semiconductor device according to a sixth embodiment.

FIG. 24 is a schematic plan view illustrating a semiconductor device according to a sixth embodiment.

The configuration of the partitioning region DA of the semiconductor device 160 illustrated in FIG. 24 is different from that of the semiconductor device 104 shown in FIG. 12. In the example, a p-n junction diode is provided in the partitioning region DA. The multiple second electrodes 12 are formed as one conductive film 12*c* and are continuous and electrically connected to each other. Otherwise, a description similar to that of the semiconductor device 104 is applicable to the configuration of the semiconductor device 160.

Figure 25:
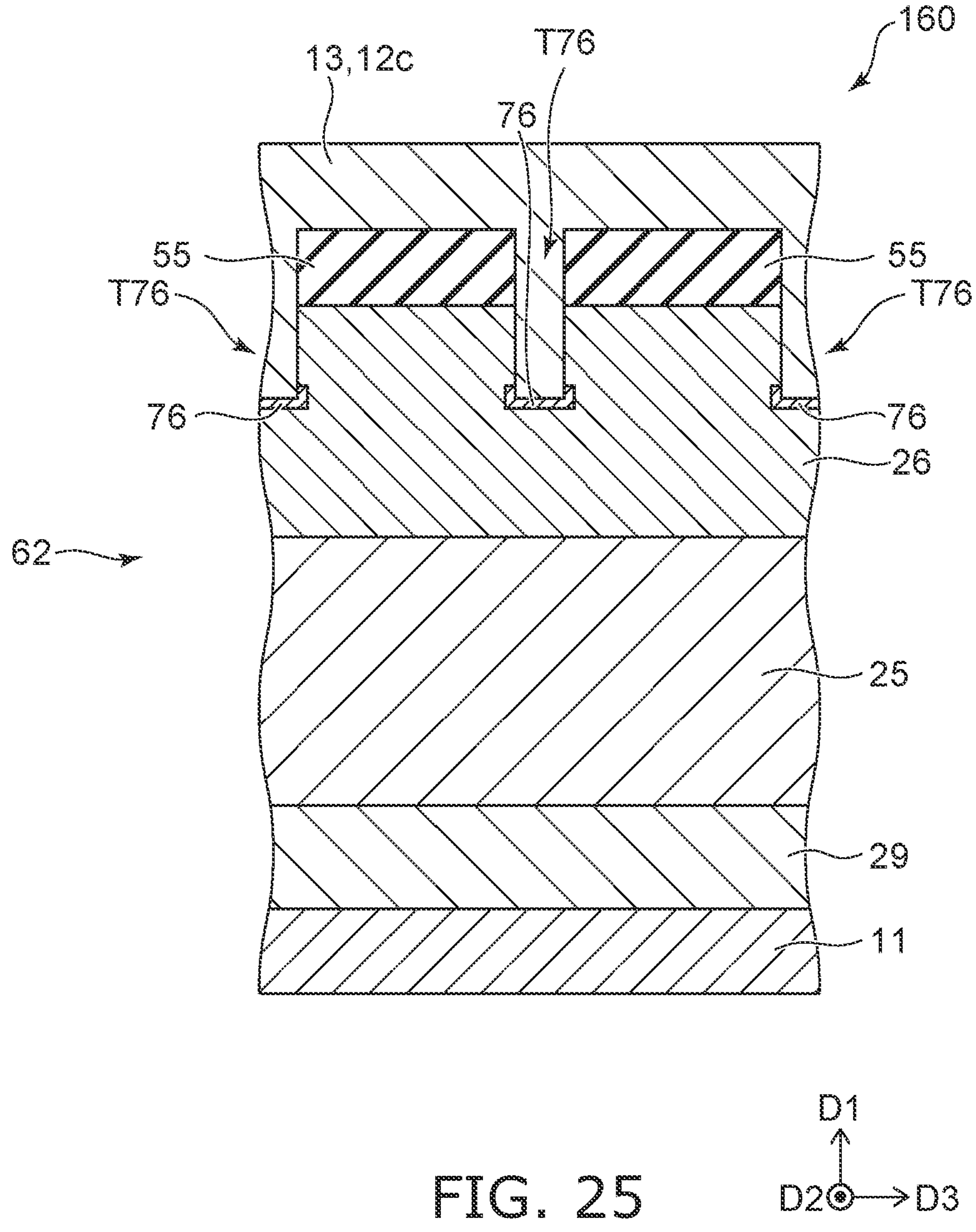
FIG. 25 is a schematic cross-sectional view illustrating the semiconductor device according to the sixth embodiment.

FIG. 25 is a schematic cross-sectional view illustrating the semiconductor device according to the sixth embodiment.

FIG. 25 is a line H-H cross section illustrated in FIG. 24. As illustrated in FIG. 25, the second semiconductor part 62 of the partitioning region DA is located on the first electrode 11. The second semiconductor part 62 includes the semiconductor region 29 (a cathode region), the fifth semiconductor region 25 (a drift region), the sixth semiconductor region 26 (an anode region), and multiple contact parts 76. The partitioning region DA includes the third electrode 13 (an anode electrode).

The fifth semiconductor region 25 is located on the first electrode 11 with the semiconductor region 29 interposed. The fifth semiconductor region 25 and the semiconductor region 29 are of the first conductivity type. The first-conductivity-type impurity concentration of the fifth semiconductor region 25 is less than the first-conductivity-type impurity concentration of the semiconductor region 29. The sixth semiconductor region 26 is located on a portion of the fifth semiconductor region 25. The sixth semiconductor region 26 is of the second conductivity type.

The fifth semiconductor region 25 and the semiconductor region 29 of the partitioning region DA may be portions of the same semiconductor layer continuous with the semiconductor region 28 of the unit element region AA and the first semiconductor region 21. On the other hand, the sixth semiconductor region 26 may not be continuous with the second semiconductor region 22. That is, a semiconductor region of the first conductivity type (e.g., a portion of the first semiconductor region 21 or the fifth semiconductor region 25) may be located between the sixth semiconductor region 26 and the second semiconductor region 22.

The multiple contact parts 76 are located on a portion of the sixth semiconductor region 26. More specifically, the contact part 76 is located at the bottom portion of a trench T76 provided in the sixth semiconductor region 26. The contact part 76 is of the second conductivity type. The second-conductivity-type impurity concentration of the contact part 76 is greater than the second-conductivity-type impurity concentration of the sixth semiconductor region 26.

The third electrode 13 is located on the sixth semiconductor region 26 and electrically connected with the sixth semiconductor region 26. The contact part 76 is located between the third electrode 13 and the sixth semiconductor region 26 and contacts the third electrode 13 and the sixth semiconductor region 26. The contact part 76 electrically connects the third electrode 13 to the sixth semiconductor region 26. For example, the contact part 76 has an ohmic contact with the third electrode 13. The insulating film 55 is located between the sixth semiconductor region 26 and the third electrode 13. The third electrode 13 is continuous with the second electrode 12 of the unit element region AA and electrically connected to the second electrode 12. The third electrode 13 may be a portion of the conductive film 12*c* that includes the second electrode 12.

The regions between the unit element regions AA that are adjacent to each other (the regions d1 to d4) may have configurations similar to FIG. 25. However, the multiple contact parts 76 (the trench T76) extend along the outer perimeters (the sides) of the adjacent unit element regions AA. Specifically, for example, as illustrated in FIG. 24, the contact part 76 extends in the second direction D2 in the partitioning region DA between the first unit element region A1 and the second unit element region A2 (the region d1) and between the third unit element region A3 and the fourth unit element region A4 (the region d2). For example, the contact part 76 extends in the third direction D3 in the partitioning region DA between the first unit element region A1 and the third unit element region A3 (the region d3) and between the second unit element region A2 and the fourth unit element region A4 (the region d4). The contact part 76 may not be provided at the intersection Cl of the lattice shape of the partitioning region DA.

When the third electrode 13 has a higher potential than the first electrode 11, the p-n junction between the fifth semiconductor region 25 and the sixth semiconductor region 26 has a forward bias; and a current can flow from the third electrode 13 toward the first electrode 11. Conversely, when the first electrode 11 has a higher potential than the third electrode 13, the p-n junction between the fifth semiconductor region 25 and the sixth semiconductor region 26 has a reverse bias; and the flow of the current is suppressed. The diodes that are formed in the partitioning region DA function as body diodes connected in parallel with the transistors formed in the unit element regions AA.

Thus, in the semiconductor device 160, an element (a p-n junction diode) is located also in the partitioning region DA. The partitioning region DA can be effectively utilized thereby, and the ineffective area can be reduced. Also, for example, the surface area of the p-n junction can be increased, and the surface area of the diode can be increased. For example, a forward voltage Vf of the diode can be reduced thereby.

Modification 6

Figure 26:
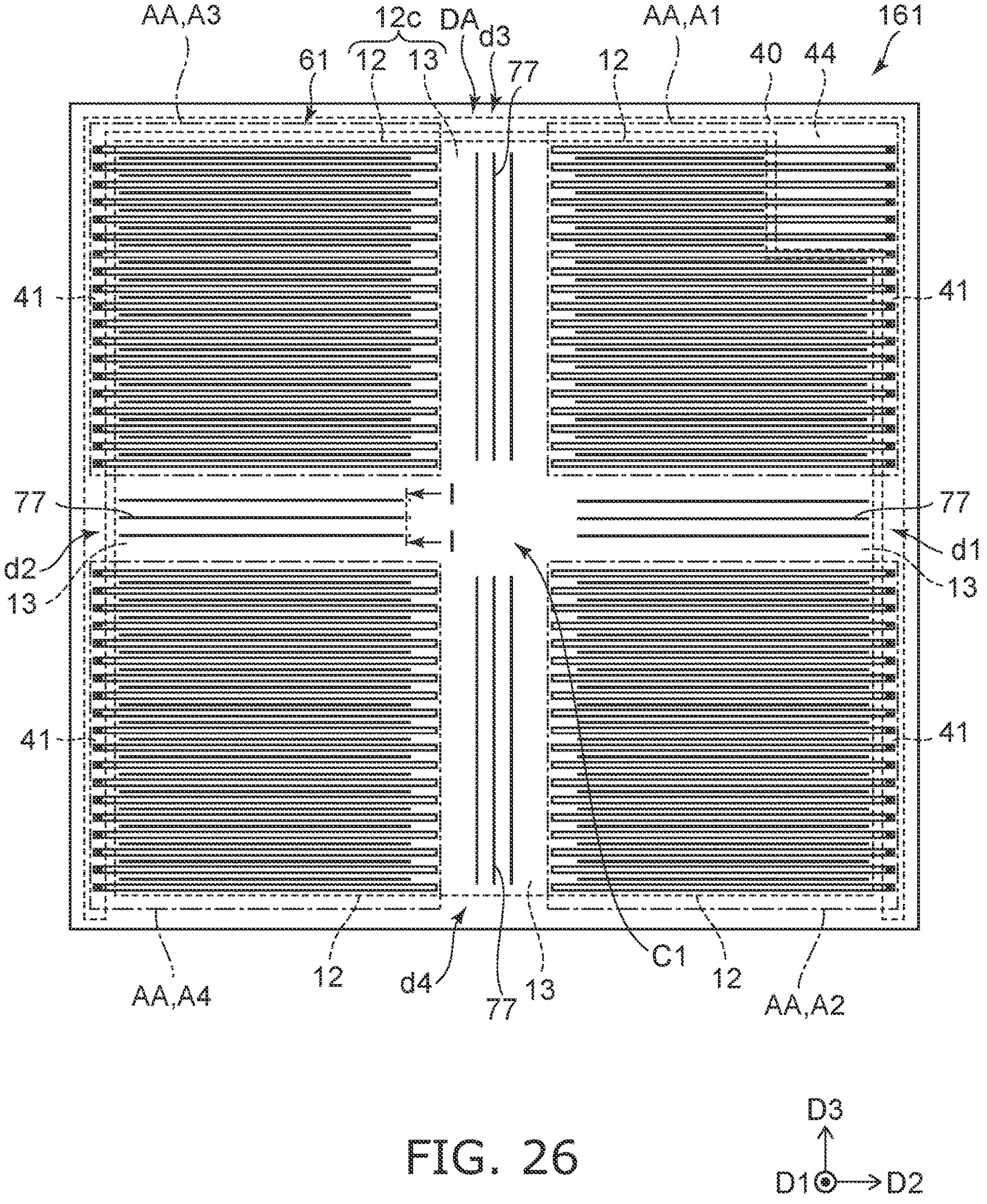
FIG. 26 is a schematic plan view illustrating a modification of the semiconductor device according to the sixth embodiment.

FIG. 26 is a schematic plan view illustrating a modification of the semiconductor device according to the sixth embodiment.

The configuration of the partitioning region DA of the semiconductor device 161 illustrated in FIG. 26 is different from that of the semiconductor device 160 shown in FIG. 24. In the example, a Schottky barrier diode is provided in the partitioning region DA instead of the p-n junction diode. Otherwise, a description similar to that of the semiconductor device 160 is applicable to the configuration of the semiconductor device 161.

Figure 27:
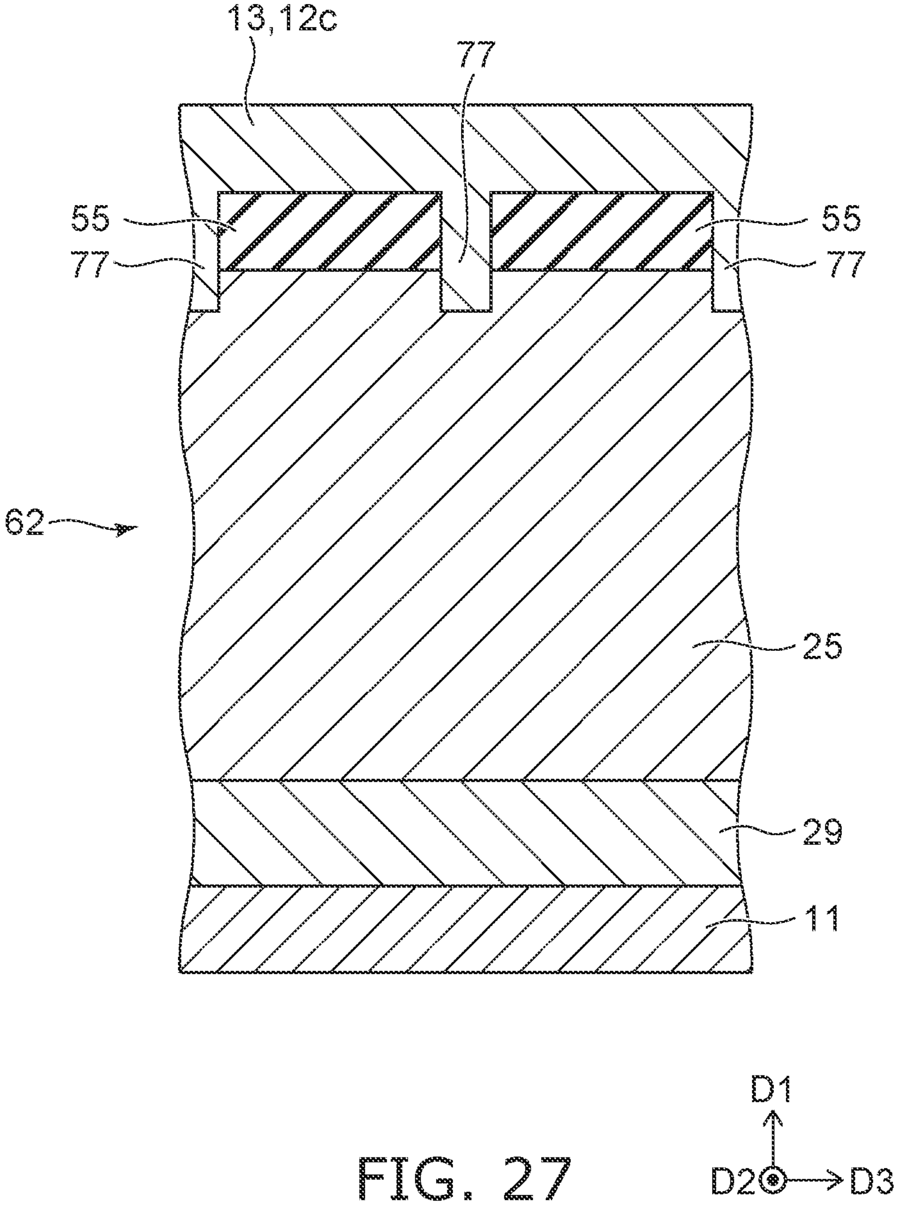
FIG. 27 is a schematic cross-sectional view illustrating the modification of the semiconductor device according to the sixth embodiment.

FIG. 27 is a schematic cross-sectional view illustrating the modification of the semiconductor device according to the sixth embodiment.

FIG. 27 is a line I-I cross section illustrated in FIG. 26. As illustrated in FIG. 27, the second semiconductor part 62 of the partitioning region DA is located on the first electrode 11. The second semiconductor part 62 includes the semiconductor region 29 (a cathode region) and the fifth semiconductor region 25. The partitioning region DA includes multiple contact parts 77 and the third electrode 13.

The fifth semiconductor region 25 is located on the first electrode 11 via the semiconductor region 29. The fifth semiconductor region 25 and the semiconductor region 29 are of the first conductivity type. The third electrode 13 is located above the fifth semiconductor region 25 and electrically connected with the fifth semiconductor region 25 via the contact part 77. The third electrode 13 is continuous with the second electrode 12 of the unit element region AA and electrically connected to the second electrode 12. The third electrode 13 may be a portion of the conductive film 12*c* that includes the second electrode 12. The insulating film 55 is located between the fifth semiconductor region 25 and the third electrode 13.

The contact part 77 is located on the fifth semiconductor region 25 and has a Schottky contact with the fifth semiconductor region 25. For example, the contact part 77 is a conductive body that is continuous with the third electrode 13, extends downward from the third electrode 13, and contacts the fifth semiconductor region 25. The contact part 77 may be a portion of the conductive film 12*c* that includes the third electrode 13. The contact part 77 extends through the insulating film 55 and contacts the fifth semiconductor region 25. Thus, the contact part 77 forms a Schottky junction with the fifth semiconductor region 25 and electrically connects the fifth semiconductor region to the third electrode 13.

The regions (the regions d1 to d4) between the unit element regions AA that are adjacent to each other may have configurations similar to FIG. 27. However, the multiple contact parts 77 extend along the outer perimeters (the sides) of the adjacent unit element regions AA. The contact part 77 may not be provided at the intersection Cl of the lattice shape of the partitioning region DA.

When the third electrode 13 has a higher potential than the first electrode 11, the Schottky junction between the conductive film 12*c* and the fifth semiconductor region 25 has a forward bias; and a current can flow from the third electrode 13 toward the first electrode 11. Conversely, when the first electrode 11 has a higher potential than the third electrode 13, the Schottky junction has a reverse bias; and the flow of the current is suppressed by the Schottky barrier. These regions function as body diodes connected in parallel with the transistors formed in the unit element regions AA.

Thus, in the semiconductor device 160, elements (Schottky diodes) are located in the partitioning region DA as well. The partitioning region DA can be effectively utilized thereby, and the ineffective area can be reduced. When a Schottky barrier diode is formed, the forward voltage Vf of the diode is easily reduced compared to a p-n junction diode. For example, because Schottky diodes are unipolar devices, the reverse recovery time when switching is easily reduced compared to bipolar devices.

According to embodiments, a semiconductor device having higher productivity can be provided.

In each of the embodiments described above, the relative levels of the impurity concentrations between the semiconductor regions can be confirmed using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. The relative levels of the impurity concentrations between the semiconductor regions can be considered to be equivalent to the relative levels of the carrier concentrations between the semiconductor regions. The impurity concentration in each semiconductor region can be measured by, for example, SIMS (secondary ion mass spectrometry).

In this specification, being "electrically connected" includes not only the case of being connected in direct contact, but also the case of being connected via another conductive member, etc.

In the specification of the application, "perpendicular" refers to not only strictly perpendicular but also include, for example, the fluctuation due to manufacturing processes, etc. It is sufficient to be substantially perpendicular.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device, comprising:

a first electrode;

a plurality of unit element regions, each of the unit element regions including:

a first semiconductor part including:

a first semiconductor region located above the first electrode, the first semiconductor region being of a first conductivity type, a second semiconductor region located on the first semiconductor region, the second semiconductor region being of a second conductivity type, and a third semiconductor region located on the second semiconductor region, the third semiconductor region being of the first conductivity type, a second electrode located on the second and third semiconductor regions and electrically connected with the second and third semiconductor regions, and a first conductive part facing the second semiconductor region via a first insulating film; and a partitioning region including a second semiconductor part and partitioning the plurality of unit element regions, the second semiconductor part being continuous with the first semiconductor part, wherein:

at least a portion of the plurality of unit element regions include a common pattern, the plurality of unit element regions include a first unit element region and a second unit element region;

the first unit element region includes:

a first wiring part located above the first semiconductor part and electrically connected with the first conductive part; and a conductive region located above the first semiconductor part and electrically connected with the first wiring part, the conductive region is wider than the first wiring part, a conductive film includes the first wiring part and the conductive region and surrounds the second electrode, the second unit element region includes the first wiring part, and an area of the second electrode in the second unit element region is larger than an area of the second electrode in the first unit element region.

2. The device according to claim 1, wherein the plurality of unit element regions are periodically arranged.

3. The device according to claim 1, wherein the common pattern is at least one of a pattern of the first conductive part, a pattern of the second semiconductor region, or a pattern of the second electrode.

4. The device according to claim 1, wherein:

each of the plurality of unit element regions includes a plurality of first trenches provided in the first semiconductor part, the plurality of first trenches extending in an extension direction along a surface of the first semiconductor part, a plurality of the first conductive parts are located in each of the plurality of unit element regions, the plurality of first conductive parts are located inside the plurality of first trenches and electrically connected with the first wiring part, a portion of the plurality of first trenches includes:

a first trench part located under the second electrode; and a second trench part located under the conductive region, and the conductive region extends in the extension direction from the first trench part.

5. The device according to claim 4, wherein;

in the first unit element region, the first semiconductor part includes a fourth semiconductor region located under the conductive region, a second-conductivity-type impurity concentration in the fourth semiconductor region is greater than a second-conductivity-type impurity concentration in the second semiconductor region, a portion of the plurality of first conductive parts of the first unit element region includes:

a first portion located in the first trench part; and a second portion located in the second trench part, and the second portion extends in the extension direction from the first portion.

6. The device according to claim 4, wherein:

a portion of the plurality of first conductive parts of the first unit element region includes:

a first portion located in the first trench part; and a second portion located in the second trench part, the second portion extends in the extension direction from the first portion, the first unit element region includes a second insulating film located between the second portion and the first semiconductor region, and a thickness of the second insulating film is greater than a thickness of the first insulating film.

7. The device according to claim 4, wherein;

the first unit element region includes a plurality of contact parts electrically connecting the plurality of first conductive parts of the first unit element region to the first wiring part and the conductive region of the first unit element region, a second unit element region among the plurality of unit element regions includes a plurality of contact parts electrically connecting the plurality of first conductive parts of the second unit element region to the first wiring part of the second unit element region, and a pattern of the plurality of contact parts of the first unit element region is common with a pattern of the plurality of contact parts of the second unit element region.

8. The device according to claim 4, wherein;

each of the plurality of unit element regions includes a plurality of second conductive parts located inside the plurality of first trenches, the plurality of first conductive parts of the first unit element region are not located in the second trench part, and a portion of the plurality of second conductive parts of the first unit element region includes:

a portion located in the first trench part; and a portion located in the second trench part.

9. The device according to claim 4, wherein:

the second trench part includes a first end and a second end along the extending direction, the first end being located closer to the first trench part from among the first end and the second end, and the conductive region is connected to the second end of the second trench part.

10. The device according to claim 1, wherein;

in at least two of the plurality of unit element regions, the common pattern is a pattern of the conductive region.

11. The device according to claim 1, wherein;

the second semiconductor part of the partitioning region includes:

a fifth semiconductor region located above the first electrode, the fifth semiconductor region being of the first conductivity type;

a sixth semiconductor region located on the fifth semiconductor region, the sixth semiconductor region being of the second conductivity type; and a seventh semiconductor region located on the sixth semiconductor region, the seventh semiconductor region being of the first conductivity type, and the partitioning region includes:

a second trench located in the second semiconductor part;

a third conductive part located inside the second trench, the third conductive part including a portion facing a side surface of the sixth semiconductor region via an insulating film; and a third electrode located on the sixth and seventh semiconductor regions and electrically connected with the sixth and seventh semiconductor regions, the third electrode being continuous with the second electrode.

12. The device according to claim 11, wherein:

the partitioning region includes a second wiring part located above the second semiconductor part and electrically connected with the third conductive part, the second wiring part being continuous with the first wiring part, and the first wiring part and the second wiring part are positioned at an outer perimeter portion of the plurality of unit element regions and the partitioning region.

13. The device according to claim 1, wherein:

the second semiconductor part of the partitioning region includes:

a fifth semiconductor region located above the first electrode, the fifth semiconductor region being of the first conductivity type; and a sixth semiconductor region located on the fifth semiconductor region, the sixth semiconductor region being of the second conductivity type, and the partitioning region includes a third electrode located on the sixth semiconductor region and electrically connected with the sixth semiconductor region, the third electrode being continuous with the second electrode.

14. The device according to claim 1, wherein:

the second semiconductor part of the partitioning region includes a fifth semiconductor region located above the first electrode, the fifth semiconductor region being of the first conductivity type, and the partitioning region includes:

a third electrode located above the fifth semiconductor region and electrically connected with the fifth semiconductor region, the third electrode being continuous with the second electrode; and a contact part forming a Schottky junction with the fifth semiconductor region, the contact part electrically connecting the fifth semiconductor region to the third electrode.

15. The device according to claim 1, wherein;

the second unit element region is apart from the first unit element region in a first direction parallel to the second electrode, the partitioning region includes a portion of the conductive film above the second semiconductor part, the portion of the conductive film extends in a second direction orthogonal to the first direction and parallel to the second electrode between the first and second unit element regions, the portion of the conductive film is located between the first unit element region and the second unit element region along the first direction, and a length of the portion of the conductive film along the second direction is longer than a length of the portion of the conductive film along the first direction.

16. A semiconductor device, comprising:

a first electrode;

a first semiconductor part including:

a first semiconductor region located above the first electrode, the first semiconductor region being of a first conductivity type, a second semiconductor region located on the first semiconductor region, the second semiconductor region being of a second conductivity type, and a third semiconductor region located on the second semiconductor region, the third semiconductor region being of the first conductivity type;

a second electrode located on the second and third semiconductor regions and electrically connected with the second and third semiconductor regions;

a plurality of first trenches provided in the first semiconductor part, the plurality of first trenches extending in an extension direction along a surface of the first semiconductor part;

a first wiring part located above the first semiconductor part;

a plurality of first conductive parts located inside the plurality of first trenches and electrically connected with the first wiring part, each of the plurality of first conductive parts facing the second semiconductor region via a first insulating film; and a conductive region located above the first semiconductor part and electrically connected with the first wiring part, wherein:

the conductive region is wider than the first wiring part, a portion of the plurality of first trenches include:

a first trench part located under the second electrode, and a second trench part located under the conductive region, the conductive region extends in the extension direction from the first trench part, the first semiconductor part includes a fourth semiconductor region located under the conductive region, a second-conductivity-type impurity concentration in the fourth semiconductor region is greater than a second-conductivity-type impurity concentration in the second semiconductor region, a portion of the plurality of first conductive parts includes:

a first portion located in the first trench part; and a second portion located in the second trench part, the second trench part extends in the extension direction from the first portion, a plurality of cell contact parts are provided in a portion of the second semiconductor region, the plurality of cell contact parts being of the second conductivity type, and each of the plurality of cell contact parts electrically connecting the second electrode with the second semiconductor region, and the plurality of cell contact parts are provided below the second electrode in an area of the first unit element region, and are not provided below the conductive region.

* * * * *